(12) United States Patent
Holder

(10) Patent No.: US 7,465,351 B2
(45) Date of Patent: Dec. 16, 2008

(54) MELTER ASSEMBLY AND METHOD FOR CHARGING A CRYSTAL FORMING APPARATUS WITH MOLTEN SOURCE MATERIAL

(75) Inventor: John Davis Holder, Knoxville, TN (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 120 days.

(21) Appl. No.: 11/155,104

(22) Filed: Jun. 17, 2005

(65) Prior Publication Data

US 2005/0279275 A1     Dec. 22, 2005

Related U.S. Application Data

(60) Provisional application No. 60/581,308, filed on Jun. 18, 2004.

(51) Int. Cl.
*C30B 15/02* (2006.01)

(52) U.S. Cl. .............................. 117/33; 117/34; 117/214

(58) Field of Classification Search .................. 117/33, 117/34, 214
See application file for complete search history.

(56) References Cited

U.S. PATENT DOCUMENTS

| | | | |
|---|---|---|---|
| 3,591,348 A | 7/1971 | Belle, Jr. | |
| 4,036,595 A | 7/1977 | Lorenzini et al. | |
| 4,036,646 A | 7/1977 | Hellmig et al. | |
| 4,036,666 A | 7/1977 | Mlavsky | |
| 4,162,291 A | 7/1979 | Arcella et al. | |
| 4,175,610 A | 11/1979 | Zauhar et al. | |
| 4,209,162 A | 6/1980 | Petiau | |
| 4,230,674 A | 10/1980 | Taylor et al. | |
| 4,233,338 A | 11/1980 | Ricard et al. | |
| 4,246,064 A | 1/1981 | Dewees et al. | |
| 4,282,184 A | 8/1981 | Fiegl et al. | |
| 4,323,419 A | 4/1982 | Wakefield | |
| 4,353,875 A | 10/1982 | Yancey | |
| 4,382,838 A | 5/1983 | Authier | |

(Continued)

FOREIGN PATENT DOCUMENTS

FR     2772741 A1     6/1999

(Continued)

OTHER PUBLICATIONS

International Search Report, PCT/US2005/021369, dated Jun. 30, 2006.

(Continued)

*Primary Examiner*—Robert M Kunemund
(74) *Attorney, Agent, or Firm*—Armstrong Teasdale LLP

(57) ABSTRACT

A method of servicing multiple crystal forming apparatus with a single melter assembly is provided. The method includes the steps of positioning the melter assembly relative to a first crystal forming apparatus for delivering molten silicon to a crucible of the first apparatus. A heater in the melter assembly is operated to melt source material in a melting crucible. A stream of molten source material is delivered from the melter assembly to the first crystal forming apparatus. The melter assembly is positioned relative to a second crystal forming apparatus for delivering molten silicon to a crucible of the second apparatus. A stream of molten source material is transferred from the melter assembly to the second crystal forming apparatus.

15 Claims, 31 Drawing Sheets

U.S. PATENT DOCUMENTS

| | | |
|---|---|---|
| 4,396,824 A | 8/1983 | Fiegl et al. |
| 4,440,728 A | 4/1984 | Stormont et al. |
| 4,454,096 A | 6/1984 | Lorenzini et al. |
| 4,572,812 A | 2/1986 | Ciszek |
| 4,594,229 A | 6/1986 | Ciszek et al. |
| 4,627,887 A | 12/1986 | Sachs |
| 4,647,437 A | 3/1987 | Stormont et al. |
| 4,650,540 A | 3/1987 | Stoll |
| 4,659,421 A | 4/1987 | Jewett |
| 4,661,200 A | 4/1987 | Sachs |
| 4,664,742 A | 5/1987 | Tomizawa et al. |
| 4,670,096 A | 6/1987 | Schwirtlich et al. |
| 4,689,109 A | 8/1987 | Sachs |
| 4,710,260 A * | 12/1987 | Witter et al. ............... 423/350 |
| 4,769,107 A | 9/1988 | Helmreich et al. |
| 5,034,200 A | 7/1991 | Yamashita et al. |
| 5,069,741 A | 12/1991 | Kida et al. |
| 5,126,114 A | 6/1992 | Kamio et al. |
| 5,156,978 A | 10/1992 | Bathey et al. |
| 5,178,719 A | 1/1993 | Pandelisev |
| 5,211,802 A | 5/1993 | Kaneko et al. |
| 5,242,531 A | 9/1993 | Klingshirn et al. |
| 5,290,395 A | 3/1994 | Matsumoto et al. |
| 5,324,488 A | 6/1994 | Klingshirn et al. |
| 5,360,480 A | 11/1994 | Altekruger |
| 5,373,807 A | 12/1994 | Holder |
| 5,427,056 A | 6/1995 | Imai et al. |
| 5,488,923 A | 2/1996 | Imai et al. |
| 5,492,078 A | 2/1996 | Alterkruger et al. |
| 5,551,977 A | 9/1996 | Menna |
| 5,588,993 A | 12/1996 | Holder |
| 5,704,992 A | 1/1998 | Willeke et al. |
| 5,820,649 A | 10/1998 | Ogure et al. |
| 5,858,087 A | 1/1999 | Taguchi et al. |
| 5,858,486 A | 1/1999 | Metter et al. |
| 5,919,303 A | 7/1999 | Holder |
| 5,919,503 A | 7/1999 | Leusner |
| 6,071,339 A | 6/2000 | Pandelisev |
| 6,090,199 A | 7/2000 | Wallace, Jr. et al. |
| 6,093,913 A | 7/2000 | Schrenker et al. |
| 6,099,641 A | 8/2000 | Ikeda |
| 6,106,617 A * | 8/2000 | Yatsurugi ............... 117/214 |
| 6,139,811 A | 10/2000 | Cao et al. |
| 6,217,649 B1 | 4/2001 | Wallace, Jr. et al. |
| 6,284,040 B1 | 9/2001 | Holder et al. |
| 6,361,597 B1 | 3/2002 | Takase et al. |
| 6,423,137 B1 * | 7/2002 | Takase ............... 117/214 |
| 6,429,035 B2 | 8/2002 | Nakagawa et al. |
| 6,454,851 B1 | 9/2002 | Fuerhoff et al. |
| 6,506,250 B1 | 1/2003 | Breitenstein et al. |
| 6,562,132 B2 | 5/2003 | Mackintosh et al. |
| 6,596,075 B2 | 7/2003 | Igarashi et al. |
| 6,652,132 B1 | 11/2003 | Hsueh |
| 6,652,645 B2 | 11/2003 | Holder |
| 6,746,709 B2 | 6/2004 | Lauinger et al. |
| 6,908,510 B2 * | 6/2005 | Pandelisev ............... 117/27 |
| 2002/0124792 A1 | 9/2002 | Sreedharamurthy et al. |

FOREIGN PATENT DOCUMENTS

| | | |
|---|---|---|
| FR | 2831881 A1 | 5/2003 |
| JP | 05 2799166 A | 10/1993 |
| JP | 11092276 | 4/1999 |
| WO | 2005105670 A1 | 11/2005 |

OTHER PUBLICATIONS

Partial International Search Report, European Application No. 05 788 988.3-2122, dated Mar. 20, 2007, 12 pages.

Search report from Analogous Singapore Application No. 200608808-2 dated Feb. 14, 2008.

* cited by examiner

MELTER ASSEMBLY AND METHOD FOR CHARGING A CRYSTAL FORMING APPARATUS WITH MOLTEN SOURCE MATERIAL

CROSS-REFERENCE TO RELATED APPLICATION

This application is a non-provisional of U.S. Provisional Patent Application Ser. No. 60/581,308 filed Jun. 18, 2004 which is incorporated herein by reference.

BACKGROUND OF THE INVENTION

This invention relates generally to a melter assembly for melting solid silicon, and more particularly to a melter assembly and method for charging a crystal forming apparatus with molten source material.

Single crystal material having a monocrystalline structure, which is the starting material for fabricating many electronic components such as semiconductor devices and solar cells, is commonly prepared using the Czochralski ("Cz") method. Briefly described, the Czochralski method involves melting polycrystalline source material such as granular or chunk polycrystalline silicon ("polysilicon") in a quartz crucible located in a specifically designed furnace to form a silicon melt. An inert gas such as argon is typically circulated through the furnace. A relatively small seed crystal is mounted above the crucible on a pulling shaft which can raise or lower the seed crystal. The crucible is rotated and the seed crystal is lowered into contact with the molten silicon in the crucible. When the seed begins to melt, it is slowly withdrawn from the molten silicon and starts to grow, drawing silicon from the melt having a monocrystalline structure.

Large grain polycrystalline semiconductor structures suitable for use as the starting material for the production of solar cells or other electrical components may be produced by various other processes known in the art. As with the Czochralski method, such alternative processes include various apparatus that utilize molten source material (e.g. silicon) to produce a solid crystalline body (e.g. ingot, ribbon, etc.) having desired electrical conduction properties. Such processes may include block casting which entails filling a cold crucible with molten silicon and allowing the molten silicon to solidify and form a polycrystalline body. Another process, commonly known as, the Edge-defined Film Growth (EFG) method involves growing hollow crystalline bodies in diverse shapes of controlled dimensions by using capillary die members which employ capillary action to assist the transfer of molten source material from a crucible to a seed crystal connected to a pulling apparatus. Also, various ribbon growth methods exist that involve the growth of a generally flat crystalline ribbon structure that is pulled from the melt of source material.

The various existing methods for forming semiconductor material for semiconductor devices and solar cells typically include the step of melting granular polysilicon directly in a crucible or adding a charge of molten silicon to a crucible. One drawback of melting granular polysilicon directly in a crucible is that the polysilicon is preferably highly pure, dehydrogenated silicon to reduce splatter from the release of hydrogen during melting. Splatter in the crucible causes silicon to deposit on the various components of the hot zone of the crystal forming apparatus and may result in impurities in the pulled crystal or damage to the graphite and silicon-carbide coated graphite components in the hot zone. Dehydrogenated chemical vapor deposition (CVD) granular polysilicon is expensive in comparison to more readily available CVD polysilicon that is not dehydrogenated, and its use adds to the production costs of silicon wafers or other electrical components produced by the various methods.

Additional operational and mechanical problems result from the melting of solid polysilicon in the main crucible of the crystal forming apparatus. For example, a large amount of power is required to melt the polysilicon due to its high thermal conductivity and high emissivity relative to liquid silicon. Also, melting solid polysilicon in the main crucible is time consuming typically requiring 15-18 hours to melt a single 250 kg (551 lbs) charge of polysilicon. Further, the thermal stresses (both chemical and mechanical) induced in the crucible by exposure to the high melting temperatures required to melt the solid polysilicon cause particles of the crucible walls to be loosened and suspended in the melt resulting in lower crystal quality and premature failure of the crucible. Also, the crucible is subjected to mechanical stresses from the loading of solid polysilicon particles that frequently scratch or gouge the crucible wall resulting in damage to the crucible and removal of particles from the crucible walls that may contaminate the silicon melt and the bodies formed therefrom.

Various prior art methods have attempted to eliminate the requirement of melting polysilicon in a crucible. These prior art methods include providing an auxiliary crucible for melting the polysilicon located above the main crucible so that gravity feed with or without use of differential pressure allows molten silicon to flow into the main crucible during crystal growth. These existing prior art methods do not efficiently and quickly melt the solid polysilicon and do not transfer the melted silicon to the main crucible in a manner that reduces melt splatter on the hot zone parts of the crystal forming apparatus. Also, the existing methods do not provide a quick and economical way of heating the solid polysilicon to reduce melting time and increase the throughput of the crystal forming apparatus. Therefore, a need exists for a method of supplying molten silicon to a crystal forming apparatus that quickly and efficiently melts the solid polysilicon and transfers the molten silicon to the main crucible of the apparatus in a way that reduces splatter and maintains the quality of the resulting silicon crystal.

SUMMARY OF THE INVENTION

Among the several objects of this invention may be noted the provision of a silicon melter assembly and method of operation that facilitates the charging of a crystal forming apparatus with molten silicon source material; the provision of such a melter assembly and method that increases crystal yield and throughput; the provision of such a melter assembly and method that increases quality; the provision of such a melter assembly and method that allows for rapid heating of solid silicon; the provision of such a melter assembly and method that allows for the controlled heating of the silicon; the provision of such a melter assembly and method that reduces melt splatter caused by adding melt to the crystal forming apparatus; the provision of such a melter assembly and method that contains and isolates dust and melt splatter caused by adding polysilicon to a reservoir of molten silicon; and the provision of such a melter assembly and method that can recharge multiple crystal forming apparatus with a single melter.

In one aspect of the invention, a method of servicing multiple crystal forming apparatus with a single melter assembly is provided. The method includes the steps of positioning the melter assembly relative to a first crystal forming apparatus for delivering molten silicon to a crucible of the first apparatus. A heater in the melter assembly is operated to melt source material in a melting crucible. A stream of molten source material is delivered from the melter assembly to the first crystal forming apparatus. The melter assembly is positioned relative to a second crystal forming apparatus for delivering molten silicon to a crucible of the second apparatus. A stream of molten source material is transferred from the melter assembly to the second crystal forming apparatus.

Other objects and features of the present invention will be in part apparent and in part pointed out hereinafter.

BRIEF DESCRIPTION OF THE DRAWINGS

Corresponding parts are designated by corresponding reference numbers throughout the drawings.

DESCRIPTION OF PREFERRED EMBODIMENTS

Figure 1:
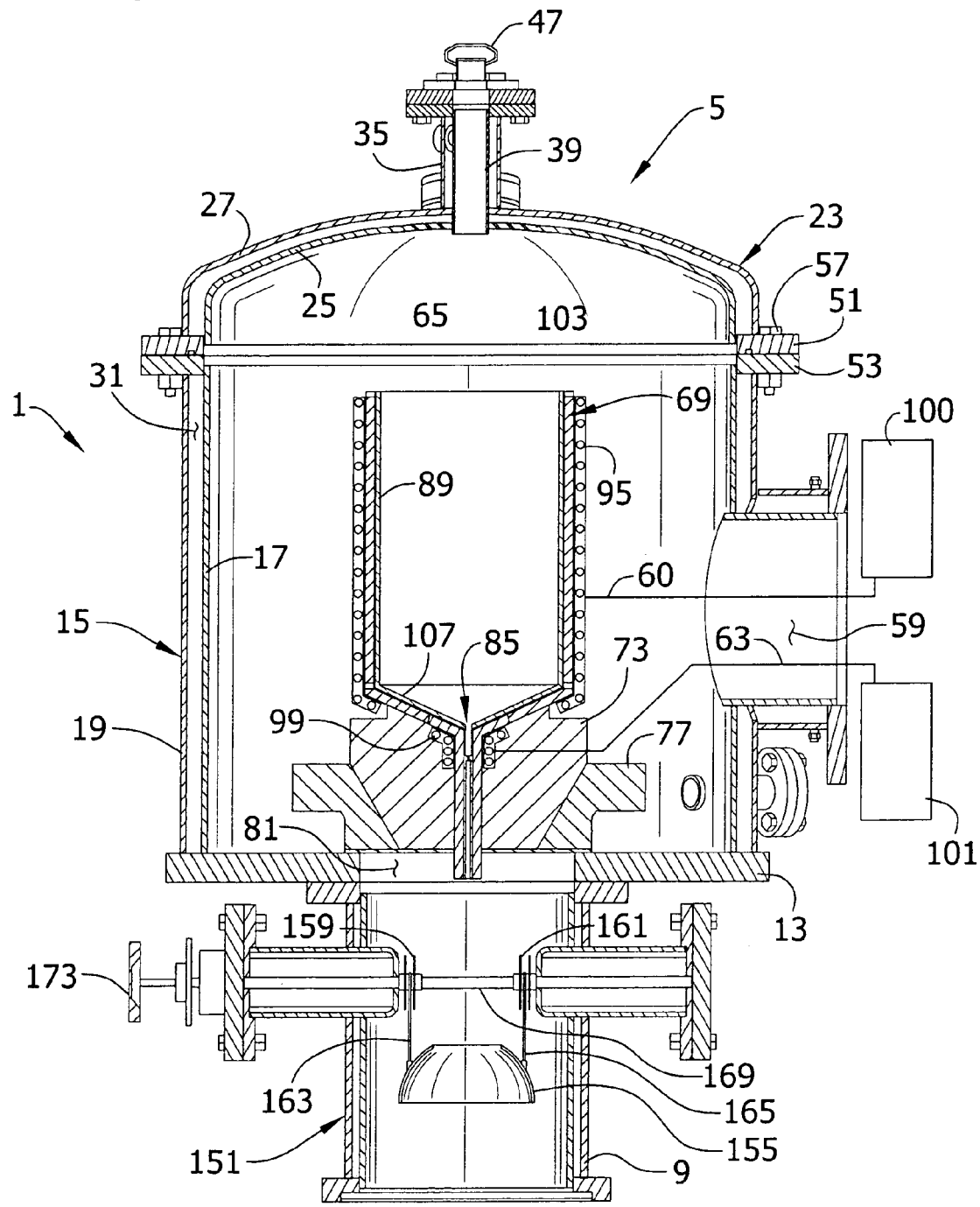
FIG. 1 is a schematic vertical section of a melter assembly of the present invention.
Figure 2:
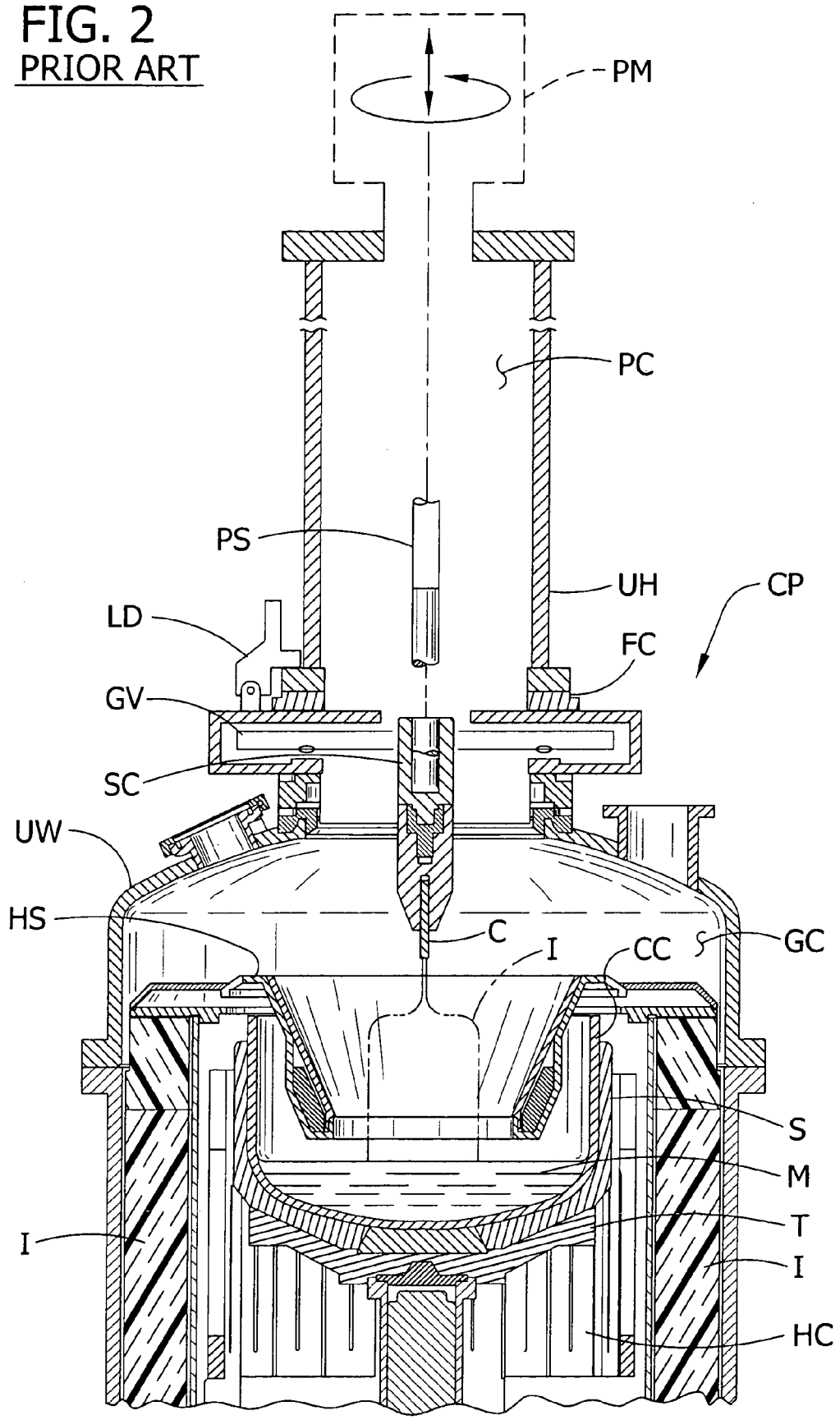
FIG. 2 is a schematic fragmentary section of a prior art crystal forming apparatus in the form of a crystal puller.

Referring to FIGS. 1 and 2, a melter assembly of the present invention, designated in its entirety by the reference numeral 1, may be used to supply molten source material to various crystal forming apparatus that are generally known in the art. One such crystal forming apparatus is a conventional crystal puller, generally designated CP, of the type used to grow monocrystalline silicon ingots (e.g., ingot I of FIG. 2) according to the Czochralski method. The crystal puller CP is shown in FIG. 2 as being configured for producing silicon ingots I. The molten source material supplied by the melter assembly of the present invention may be silicon or any other source material (e.g., alumina, barium titanate, lithium niobate, yttrium aluminum garnet, germanium, gallium, gallium arsenide, etc.) that is used in the crystal forming apparatus to produce solid crystalline bodies.

Figure 3:
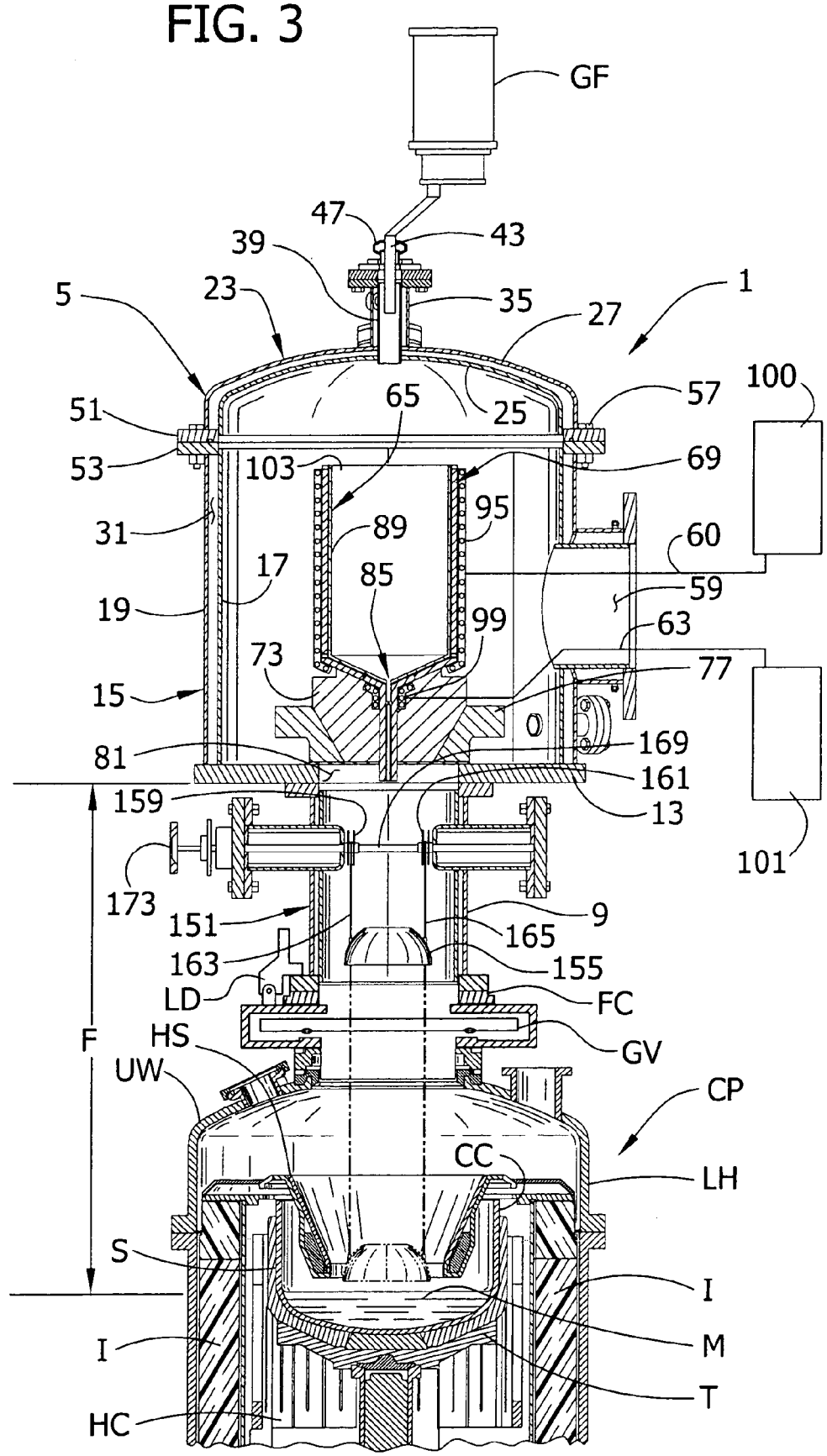
FIG. 3 is a schematic fragmentary section of the melter assembly installed on a lower housing of the crystal puller.

The crystal puller CP includes a water-cooled housing including a lower housing LH enclosing a lower crystal growth chamber GC and an upper housing UH enclosing an upper pull chamber PC partially shown in FIG. 2. The upper housing UH and lower housing LH are removably connected by a flanged connection FC and a locking device LD. The upper housing UH and lower housing LH are isolated by a gate isolation valve GV. A pump (not shown) or other suitable means may be provided for drawing a vacuum into the interior of the housing. As shown in FIG. 3, the melter assembly 1 may be installed on the lower housing LH of the crystal puller CP in place of the upper housing UH and receive solid, granular polysilicon from a gravity feeder GF. As will be described more fully hereinafter, the melter assembly 1 melts the solid polysilicon and transfers molten silicon by gravity feed to the crystal puller CP or other crystal forming apparatus.

Referring again to FIG. 2, the crystal puller CP is a conventional crystal puller for producing monocrystalline silicon ingots I according to the Czochralski method. In the illustrated embodiment, the crystal puller CP is a Model No.

FX150 crystal grower furnace manufactured by Kayex Corporation of Rochester, N.Y., but it will be understood that other crystal pullers may be used without departing from the scope of this invention. The lower housing LH enclosing the crystal growth chamber GC has a generally dome shaped upper wall UW and houses a quartz crystal growth crucible CC seated in a graphite susceptor S. The crucible CC contains molten source material M from which the monocrystalline silicon ingot I is grown. The susceptor CS is mounted on a turntable T for rotation of the susceptor S and crucible CC about a central longitudinal axis of the crystal puller CP. The crucible CC is also capable of being raised within the growth chamber GC to maintain the surface of the molten source material M at a generally constant level as the ingot I is grown and source material is removed from the melt.

An electrical resistance heater HC surrounds the crucible CC for heating the crucible to maintain the source material M in a molten state. The heater HC is controlled by an external control system (not shown) so that the temperature of the molten source material M is precisely controlled throughout the pulling process. A heat shield assembly HS is mounted in the growth chamber GC above the molten source material M and has a central opening sized and shaped to surround the ingot I as the ingot is pulled up from the source material. The area in the lower housing LH surrounding the crystal growth crucible is generally referred to as the "hot zone" of the puller CP. The hot zone parts include the susceptor S, heater HC, heat shield assembly HS, and heat reflectors or insulation I that control the heat transfer around the crudible CC and the cooling rate of the growing crystal.

A pull shaft PS extends down from a pulling mechanism PM capable of raising, lowering and rotating the pull shaft. The crystal puller CP may have a pull wire (not shown) rather than a shaft PS, depending upon the type of puller. The pull shaft PS extends downward through the pull chamber PC and terminates in a seed crystal chuck SC which holds a seed crystal C used to grow the monocrystalline ingot I. The pull shaft PS has been mostly broken away in FIG. 1, both at its top and where it connects to the chuck SC. In growing the ingot I, the pulling mechanism PM lowers the seed crystal C until it contacts the surface of the molten source material M. Once the seed crystal C begins to melt, the pulling mechanism PM slowly raises the seed crystal C up through the growth chamber GC and pull chamber PC to grow the monocrystalline ingot I. The speed at which the pulling mechanism PM rotates the seed crystal C and the speed at which the pulling mechanism raises the seed crystal SC are controlled by the external control system (not shown). The general construction and operation of the crystal puller CP, except to the extent explained more fully below, is conventional and known by those of ordinary skill in the art. Moreover, it will be understood that the crystal puller CP can have other configurations without departing from the scope of the present invention.

As shown in FIGS. 1 and 3, the melter assembly 1 comprises a melting vessel, generally designated 5, and a docking collar 9 extending down from the bottom of the melting vessel for connection to the lower housing LH of the crystal puller CP. The melting vessel 5 includes an annular floor 13, projecting up from which is a tubular side wall, generally designated 15, formed by spaced inner and outer wall members 17, 19. A top wall, generally designated 23, of the melting vessel 5 is generally dome-shaped, and is formed by inner and outer spaced wall members 25, 27. The spaced wall members of the tubular wall 15 and top wall 23 define a cavity 31 through which cooling water may be circulated. A central feed portal 35 in the top wall 23 of vessel 5 has a sleeve 39 that receives a feed tube 43 of the gravity feeder GF. The central feed portal 35 has a vacuum seal 47 to seal the atmosphere in the melter assembly 1 and gravity feeder GF. The atmospheres of the feeder and melter assembly have substantially the same pressure and composition as the atmosphere in the crystal puller CP. The fit between the feed tube 43 and the sleeve 39 should be a loose fit with a radial clearance of approximately 13 mm (½ inch) to contain melt splatter and dust in the melter assembly 1. The top wall 23 and tubular wall 15 of the melting vessel 5 have respective mating flanges 51, 53 which receive fasteners 57 to connect the top and tubular wall together. The top wall 23 can be removed to permit access to the interior of the melting vessel 5. The melting vessel 5 has a side access port 59 that allows entry of electrical power lines (60, 63) and cooling piping (not shown) into the vessel. The side access port 59 has vacuum seals (not shown) that surround the piping and electrical lines 60, 63 that are routed through the port so that the pressure and composition of the atmosphere in the vessel 5 is maintained.

The melting vessel 5 contains a melting crucible, generally indicated 65, made of a suitable material such as fused quartz (or fused silica) that is seated on a graphite susceptor assembly, generally indicated 69. The susceptor assembly 69 is supported by a ceramic base 73 mounted on a platform 77 that covers an opening 81 in the annular floor 13 of the melting vessel 5. The tight seal between the platform 77 and the annular floor 13 prevents melt splatter and dust from passing from the melting vessel 5 through the docking collar 9 and into the crystal puller CP. The melting crucible 65 has a nozzle, generally indicated 85, which depends from a main body 89 of the crucible and allows for the flow of molten silicon from the melting crucible to the crystal growing crucible CC in the crystal puller CP. The susceptor assembly 69 conforms to and surrounds both the main body 89 and the nozzle 85 of the melting crucible 65. The melter assembly 1 has an upper induction coil 95 around an upper section of the susceptor assembly 69 and crucible 65 and a lower induction coil 99 around a lower portion of the susceptor and the crucible nozzle 85. The upper and lower induction coils 95, 99 are connected to a respective power supply 100, 101 (shown schematically in FIGS. 1 and 3) that provides electric current that can flow through each respective coil. The upper and lower coils 95, 99 can be separately controlled so that the current flowing through each coil can be monitored and adjusted without regard for the current flowing through the other coil. The arrangement of the two coils 95, 99 around the upper and lower sections of the melting crucible 65 and susceptor 69 allows for independent temperature control in the upper and lower sections of the melting crucible.

Figure 4:
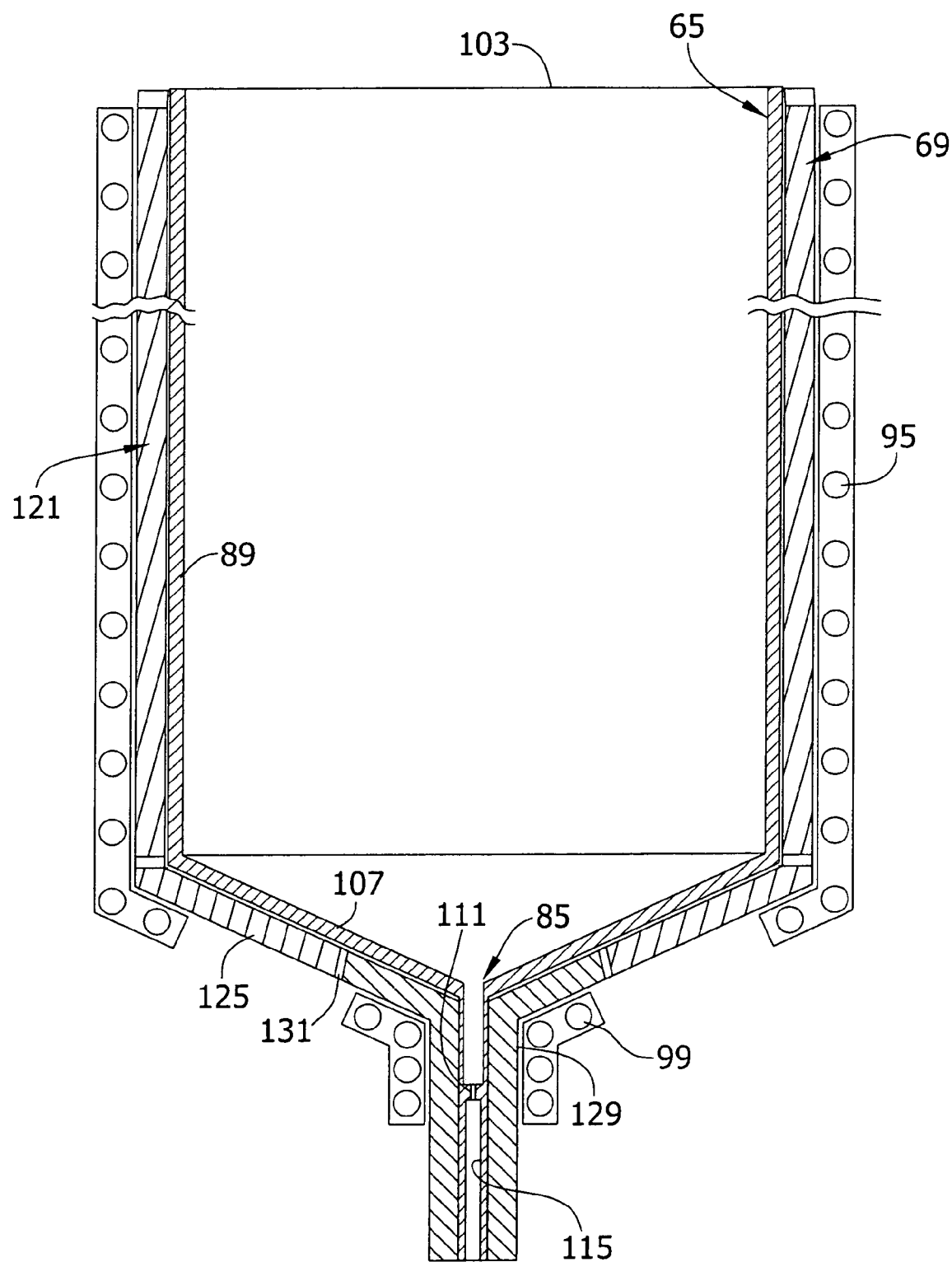
FIG. 4 is a schematic vertical section showing the melting crucible, a susceptor, and induction coils separate from the melter assembly.

With reference to FIGS. 1 and 4, the main body 89 of the melting crucible 65 is generally cylindrical and has an open top 103, and a conical bottom wall 107. The nozzle 85 depends from the conical bottom wall 107 and is coaxial with the main body 89. In one embodiment, the inner surface of the bottom wall 107 of the crucible 65 has a slope in the range of about 1 degree to about 60 degrees, more preferably about 10 degrees, to facilitate the flow of molten silicon into the nozzle 85. In the illustrated embodiment, the main body 89 of the crucible 65 including the conical bottom wall 107 is fabricated as one piece, and the bottom nozzle 85 is fabricated from a quartz tube fused to the bottom wall of the crucible. Other constructions may be used within the scope of the present invention.

Figure 9:
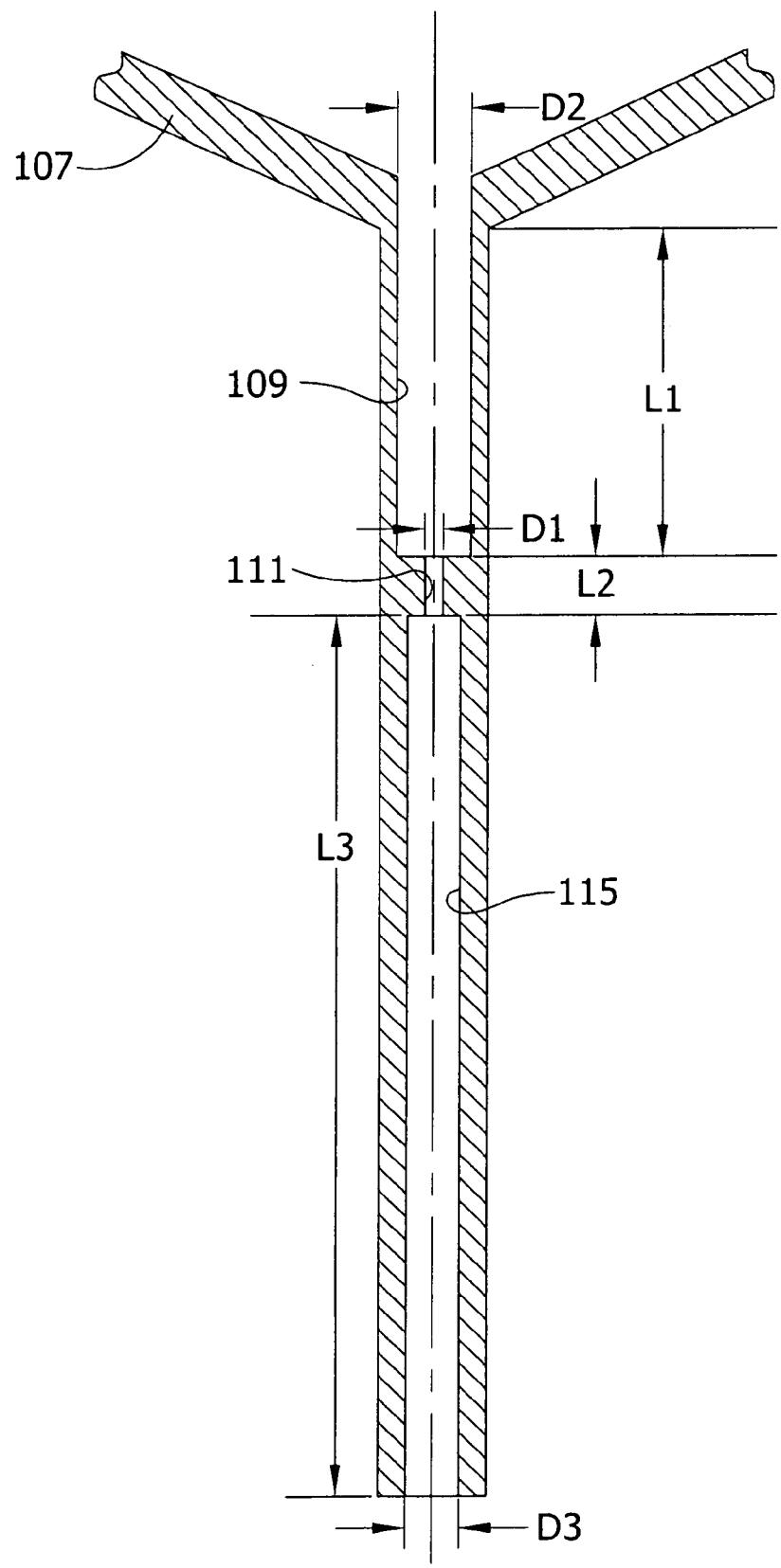
FIG. 9 enlarged fragmentary section of the melting crucible showing a nozzle.

The nozzle 85 is configured to produce flow from the melting vessel 5 that is generally directed along a path aligned with the centerline of the nozzle. It is important that the liquid silicon flowing from the crucible 65 is a directed stream to reduce splashing and spraying of the components of the crystal puller CP. Splashing and spraying of liquid silicon is not desired in the hot zone of the crystal puller CP because of possible damage to the hot zone parts (e.g., heat shield HS, crucible GC, susceptor S, etc.) and the possible creation of loose particles of silicon that could fall back into the crystal growing crucible and jeopardize the quality of the crystal. As best shown in FIG. 9, the melting crucible nozzle 85 includes a first larger diameter portion 109 in the bottom wall 107 of the crucible 65, a second portion 111 having a smaller diameter and forming an orifice of the nozzle downstream from the larger diameter portion, and a third portion 115 having an intermediate size diameter downstream of the orifice. As will be discussed in more detail below, the overall length of the nozzle 85 and the corresponding lengths and diameters of the first, second, and third portions 109, 111, 115 are sized to maintain a stream of molten silicon that flows from the crucible 65 at an optimum flow rate and avoids premature pouring. Preferably the stream of molten silicon flowing from the crucible 65 is a coherent unbroken stream of liquid but it is understood that the stream may include droplets flowing from the crucible 65 that are generally directed along the centerline of the nozzle 85. It is understood that the flow of molten silicon from the nozzle 85 may deviate from the centerline of the nozzle and still be generally directed along the path of the nozzle without departing from the meaning of "generally directed". In one embodiment, the flow of molten silicon can deviate from the centerline of the nozzle 85 by a maximum distance of approximately 40 mm (1.6 inches) and still be within the meaning of "generally directed".

As shown in FIGS. 4-8, the susceptor assembly 69 has three parts: a generally cylindric upper portion (crucible support), generally indicated 121, to support the melting crucible 65, a conical one-piece intermediate portion (melt-in susceptor) 125 for supporting the conical bottom wall 107 of the crucible 65 and initiating melting, and a lower outlet portion (nozzle susceptor) 129 that receives the nozzle 85 of the melting crucible 65. The upper portion 121 and the lower outlet portion 129 are spaced apart from the intermediate portion 125 by respective annular gaps 130, 131. In the illustrated embodiment, the upper portion 121 has four radial sections, generally designated 123 (FIG. 6), each separated by a radial gap 132. In one embodiment, the annular gaps 130, 131 and the radial gaps 132 range from approximately 3 mm (⅛ inch) to approximately 6 mm (¼ inch). The gaps 130, 131, 132 isolate the currents induced in the susceptor assembly 69 by the upper coil 95 and lower coil 99 so that the lower outlet portion 129 is heated by current induced from the lower coil, the intermediate portion 125 is heated by current induced from the upper coil, and the upper portion 121 is not heated by current induced from either coil. It is understood that the upper coil 95 and lower coil 99 may be assembled in a ceramic body (not shown) that contains graphite fiber insulation (not shown) in the annular gaps 130, 131 between respective portion 121, 125, and 129 of the susceptor assembly and graphite insulation (not shown) between the radial gaps 132 between respective sections 123 of the upper portion 121 of the susceptor assembly. It is understood that the insulation may include other materials such as quartz sand, ceramic refractory fiber, vitrious refractory fiber, or any other high-temperature thermally and electrically insulating material.

Figure 5:
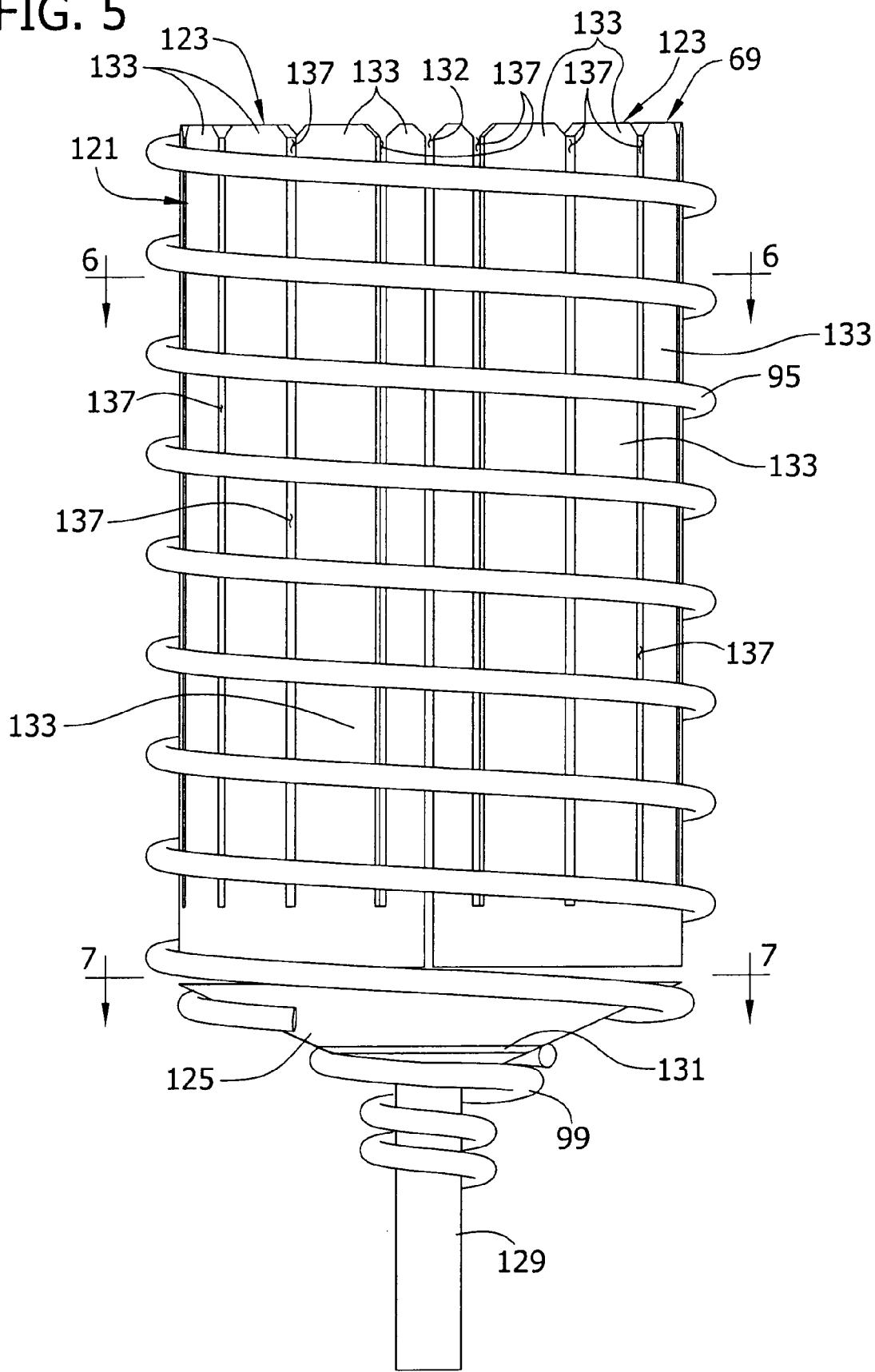
FIG. 5 is a elevation of the susceptor, melting crucible, and induction coils separate from the melter assembly.
Figure 6:
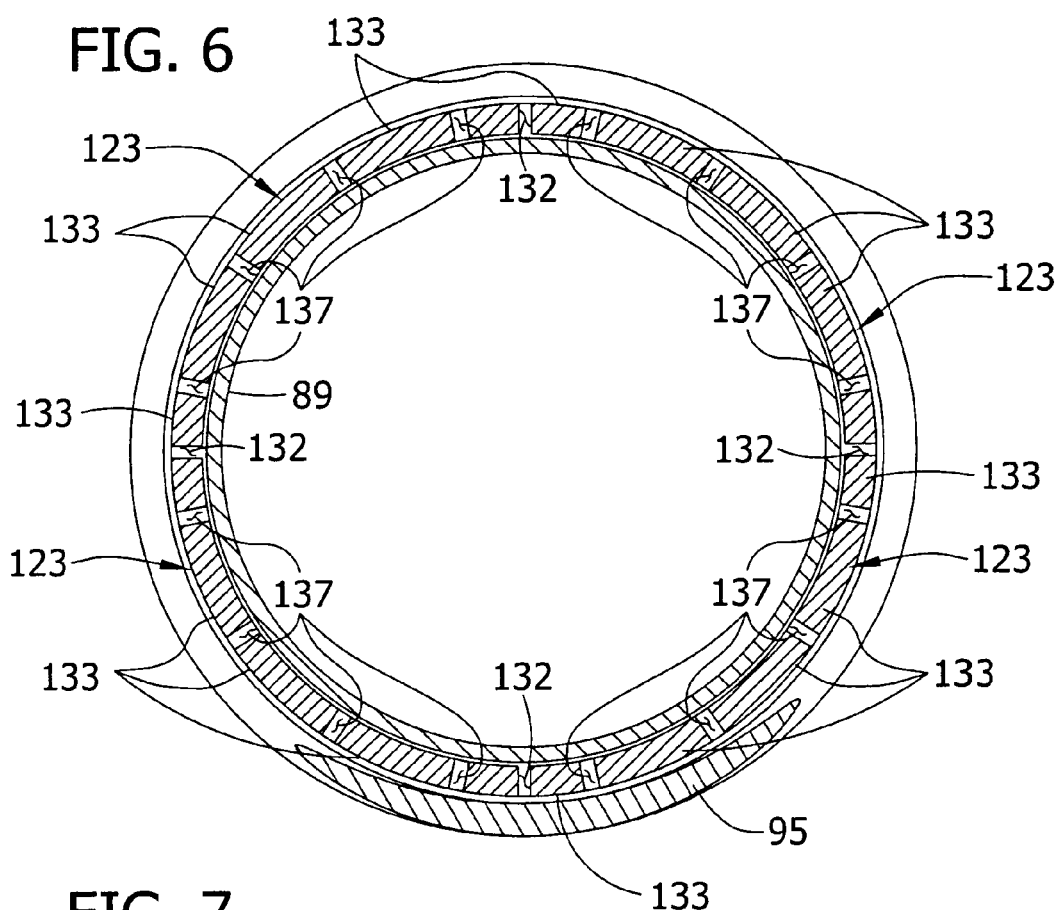
FIG. 6 is a cross-section taken along the plane including line 6-6 of FIG. 5.
Figure 7:
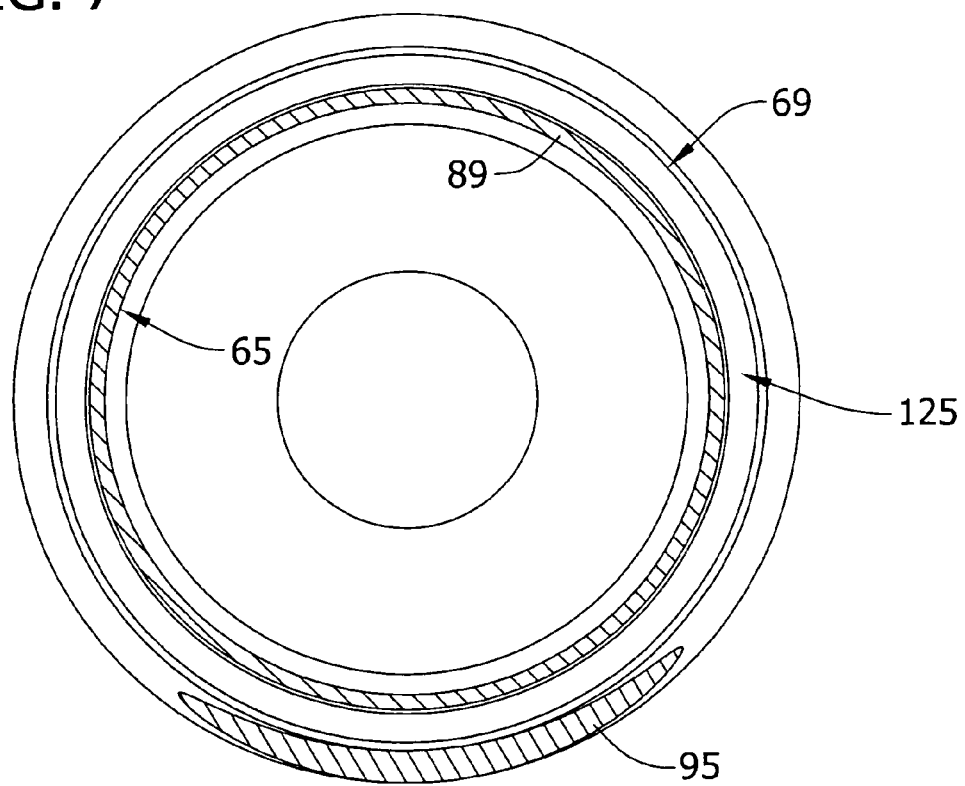
FIG. 7 is a cross-section taken along the plane including line 7-7 of FIG. 5.
Figure 8:
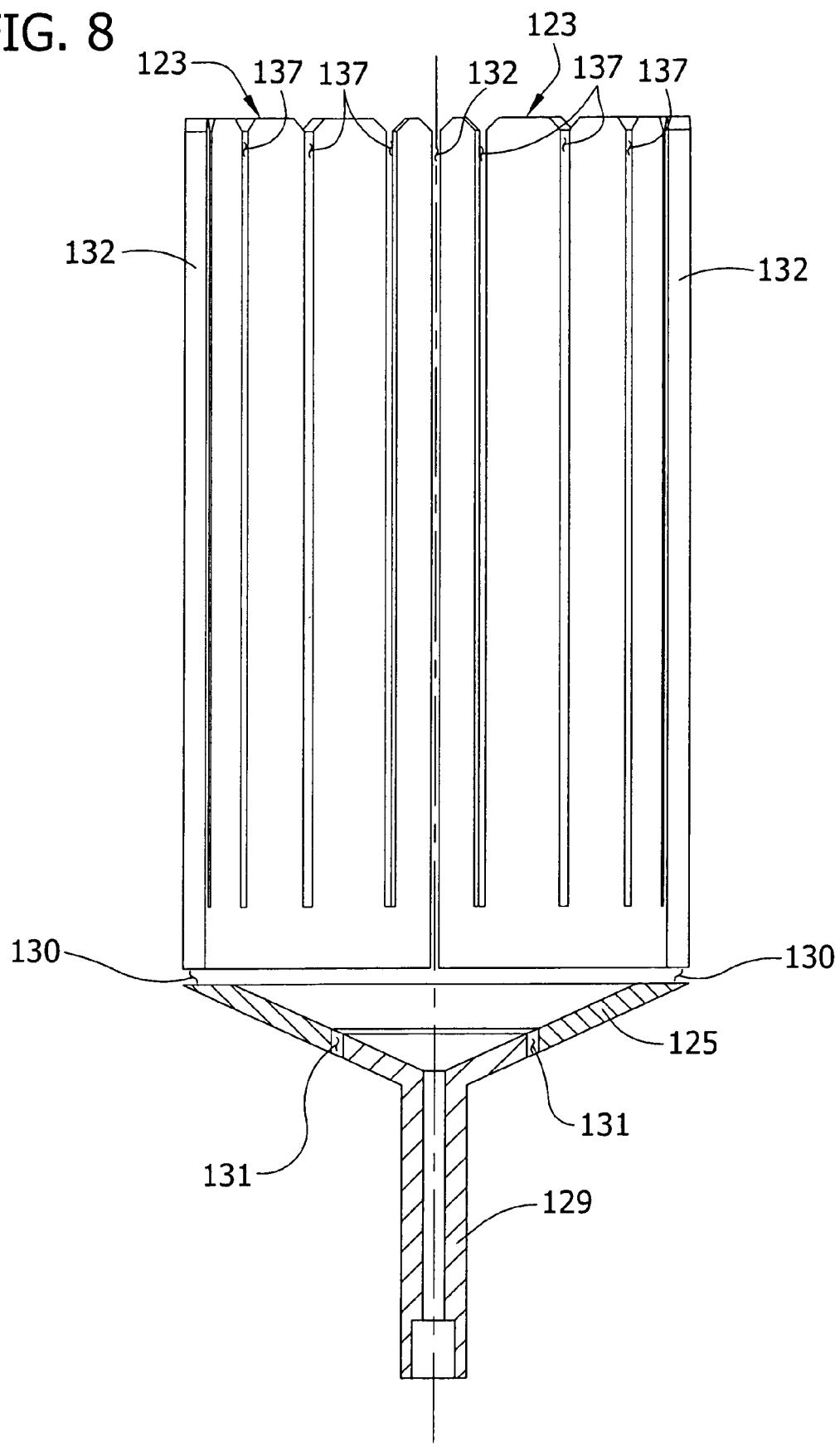
FIG. 8 is an exploded vertical section of the susceptor.

As shown in FIGS. 5 and 6, the upper body 121 has a series of fingers 133 that are spaced apart in a circumferential direction to form gaps 137 in the upper body. The gaps 137 between the fingers 133 and the gaps 132 between the sections 123 of the upper portion 121 prevent the upper portion from electrically coupling to the upper induction coil 95 and prevent an induction current from flowing in the fingers of the susceptor assembly 69. In the illustrated embodiment, sixteen fingers 133 are shown but it is understood that the susceptor 69 may have other designs without departing from the scope of this invention. Each of the radial gaps 132 divide one of the fingers 133 in half and the gaps are spaced apart approximately 90 degrees from each other. The gaps 137 between the fingers 133 preferably range from approximately 3 mm (⅛ inch) to approximately 6 mm (¼ inch). Because no current is induced in the fingers 133 of the susceptor assembly 69, the upper portion 121 of the susceptor does not generate a large amount of resistance heating. Rather, the resistance heating of the lower portion of the susceptor assembly 69 from the induced current from the upper and lower coils 95, 99 heats the melting crucible 65 and the solid polysilicon in the lower portion of the crucible. The fingers 133 are not subjected to induction heating and are heated only by radiation and conduction when the silicon in the crucible is heated by the upper coil 95.

As shown in FIGS. 5-8, the conical intermediate portion 125 and lower outlet portion 129 of the susceptor assembly 69 are solid construction so that the upper and lower induction coils 95, 99 are electrically coupled to a respective portion of the susceptor in these regions. The gap 131 between the intermediate portion 125 and the outlet portion 129 electrically isolates the two portions of the susceptor assembly 69 so that the upper coil 95 does not induce current in the lower outlet portion and the lower coil 99 does not induce current in the intermediate portion. The electrical current supplied to the upper coil 95 produces an alternating magnetic field which causes electrical current to flow in the intermediate portion 125 of the susceptor assembly 69 below the fingers 133. The electrical current supplied to the lower coil 99 produces an alternating magnetic field which causes electrical current to flow in the lower outlet portion 129 of the susceptor 69. The induced electrical current in the susceptor assembly 69 flows through the susceptor in the opposite direction as the current flow in the coils 95, 99 and causes resistance heating in the susceptor. The induction heating of the solid portion of the graphite susceptor assembly 69 causes radiant and conductive heating of the bottom wall 107 of the crucible 65 so that the solid polysilicon resting on the bottom wall of the crucible melts.

After the resistance and conductive heating has melted and the bottom portion of the solid polysilicon in the crucible 65, the magnetic field of the upper coil 951 induces a current in the electrically conductive liquid silicon that further heats the liquid silicon and increases the rate of melting of the remaining solid polysilicon in the crucible by radiation and conduction heating from the liquid silicon. In one embodiment, the frequency of the alternating current supplied to the coils 95, 99 ranges from approximately 3 kHz to approximately 15 kHz and the magnitude of the power ranges from approximately 15 kW to approximately 160 kW. In one embodiment, the electrical current in the upper coil 95 has a frequency of approximately 10 kHz and power of approximately 160 kW, and the electrical current in the lower coil 99 has a frequency of approximately 3 kHz and power of approximately 15 kW. It will be understood that each power supply 100, 101 may comprise a power converter, a motor-generator, a pulse-width modulator inverter, or any other means for supplying alternating current to the coils.

In one embodiment, the cylindric body 121 of the susceptor assembly 69 may have a height of approximately 38 cm (15 inches), an inside diameter of approximately 20 cm (8 inches), and a wall thickness of approximately 13 mm (½ inch). The bottom wall of the conical portion 125 of the susceptor 69 may be angled to correspond with the angled bottom wall 107 of the crucible 65 and may range from approximately 1 degree to approximately 60 degrees (more preferably about 10 degrees) without departing from the scope of this invention. The lower outlet portion 129 of the susceptor 69 may extend from the bottom wall of the conical portion 125 of the susceptor by approximately 16.5 cm to 30 cm (6.5 inches to approximately 12 inches). It will be understood that the dimensions are exemplary only and the crucible 65 and susceptor 69 may have other dimensions without departing from the scope of present invention.

The current through the upper coil 95 may be varied to control the temperature of the melt in the crucible 65 and the current through the lower coil 99 may be varied to control the temperature of the melt passing through the crucible nozzle 85. For example, the temperature of the melt in the melting crucible 65 must be above the melting temperature of silicon (1414 degrees C.) by a sufficient amount so that the melt being poured into the crystal growing crucible CC of the crystal puller CP remains above the melting temperature of silicon during the free fall from the melting crucible to the crystal growing crucible. Based on a free fall height F (FIG. 3) of approximately 5 feet (1.5 meters), the silicon liquid passing through the nozzle 85 should have at least 20 degrees of superheat (corresponding to a minimum temperature of approximately 1434 degrees C.) so that the silicon flow stream remains liquid for the entire distance between the larger diameter portion 109 of the melting crucible nozzle and the surface of the melt M in the crystal growing crucible CC of the crystal puller CP. Also, the temperature of the molten silicon passing through the quartz nozzle 85 of the melting crucible 65 should not exceed approximately 1465 degrees C. in order to prevent excessive ablation of the nozzle as a result of the flow of superheated liquid silicon through the nozzle. If the molten silicon passing through the nozzle 85 is allowed to flow at a temperature above 1465 degrees C., the first and second nozzle portions 111, 115 will prematurely become too large and the mass flow rate of liquid silicon will exceed the desired melting rate of the polysilicon. The mass flow rate of liquid silicon through the nozzle 85 should be less than or equal to the desired melting rate of the polysilicon in the crucible 65 so that height of the melt in the crucible remains generally constant during the filling of the crystal growing crucible CC. If the flow rate from the crucible 65 exceeds the melting rate of polysilicon, the melt height in the crucible 65 will drop during filling of the crystal growing crucible CC causing a reduction in the static pressure at the nozzle 85. If the static pressure at the nozzle 85 drops below a predetermined level, the stream of liquid silicon passing through the nozzle will become undirected (i.e., no longer generally directed along the centerline of the nozzle) resulting in excessive splashing and spraying at the crystal growth crucible CC.

To obtain a reduction in melt preparation time needed to achieve an improvement in crystal growth productivity of at least approximately 10% to 35%, the melter assembly 1 should deliver liquid silicon at a preferred mass flow rate in the range of approximately 50 kg/hr to approximately 140 kg/hr. Through experimentation, the more preferable mass flow rate of liquid silicon from the melter assembly 1 has been determined to be approximately 85 kg/hr. The orifice 111 is sized to have an initial diameter that provides the optimum mass flow rate of liquid silicon of approximately 85 kg/hr based on an initial melt height H (FIG. 14) above the bottom outlet 85 of the crucible 65 of approximately 250 mm (10 inches). It will be understood that the orifice diameter and melt height H above the orifice 111 will vary based on the diameter and height of the melting crucible 65 as well as the desired mass flow rate from the melter assembly 1.

Referring now to FIG. 9, the orifice 11 in the nozzle 85 of the crucible 65 has an initial diameter D1 of approximately 2.3 mm (0.09 inch) corresponding to an initial melt height H (FIG. 14) of approximately 250 mm (10 inches) and a liquid silicon flow rate of approximately 85 kg/hr. It will be understood that as the melter assembly 1 is used in filling successive crystal pullers CP with molten silicon, the orifice diameter D1 will increase due to ablation of the wall thickness of the crucible nozzle 85 by the flow of liquid silicon therethrough. Accordingly, the initial melt height H above the orifice 111 is preferably reduced as the diameter of the orifice increases to maintain an optimum mass flow rate of liquid silicon. The mass flow rate of liquid silicon through the orifice 111 is determined by application of Torricelli's Law that states the velocity (v) of liquid leaving an orifice equals the square root of twice the height above the orifice (h) times a gravitational constant (g) or $$v=(2 \times h \times g)^{1/2}$$

where v=velocity of liquid passing through orifice,
where h=melt height H, and
g=gravitational constant.

The mass flow rate of the liquid flowing through the orifice 111 is then calculated by multiplying the velocity of liquid from the above equation by the area of thee orifice and the density of the liquid.

The relative size of the orifice 111 of the nozzle 85 is monitored by regulating the melt H that is required to maintain the desired mass flow rate of liquid silicon from the crucible 65 during successive operations of the melter assembly 1. When the orifice 111 has ablated such that the desired mass flow rate of liquid silicon exceeds the attainable melting rate, the crucible 65 is replaced. In one embodiment, the orifice diameter D1 may be allowed to increase to 3.0 mm (0.12 inch) before the melting crucible 65 is replaced. To maintain a liquid silicon flow rate of 85 kg/hr at an orifice diameter D1 of about 3.0 mm (0.12 inch), the melt height H must be lowered to approximately 177 mm (7.0 inches).

To avoid excessive splashing of liquid silicon as it impinges the melt pool M in the crystal growing crucible CC, a directed stream of liquid silicon must flow from the crucible nozzle 85 to the melt in the crystal growing crucible. Based on the results of testing various nozzle designs at a liquid silicon flow rate of approximately 85 kg/hr, the preferred design of the melting crucible nozzle 85 was determined to include an initial diameter D2 for the first portion 109 of approximately 6 to 14 mm (0.24 to 0.55 inch), or more preferably approximately 10 mm (0.39 inch), and a length L1 of the first portion of approximately 50 to 60 mm (1.96 to 2.4 inches), or more preferably approximately 55 mm (2.16 inches). The orifice 111 of the nozzle 85 may have an initial inner diameter D1 ranging from approximately 2.1 to 2.3 mm (0.08 to 0.09 inch), or more preferably approximately 2.2 mm (0.087 inch), and a length L2 of approximately 8 to 12 mm (0.39 to 0.47 inch), or more preferably approximately 10 mm (0.39 inch). The third portion 115 may have an inside diameter D3 ranging from approximately 3 to 8 mm (0.12 to 0.31 inch), more preferably approximately 3 mm (0.12 inch), and a length L3 ranging from approximately 76 mm to 210 mm (3.0 inches to 8.33 inches), more preferably approximately 118 mm (4.6 inches). It was determined, that the preferred length L3 of the third portion 115 of the nozzle 85 can be calculated in millimeters from the following formula:

$$L3=50+(50 \times D3/D1).$$

The above formula can be used to determine the preferred length L3 of the third portion 115 of the nozzle 85 for a mass flow of liquid silicon ranging from approximately 50 kg/hr to approximately 140 kg/hr. It will be appreciated that the preferred configuration of the first, second, and third portions 109, 111, 115 of the nozzle 85 depends upon various factors, including the desired mass flow rate of liquid silicon. Accordingly, the present invention is not limited to specific dimensions of the nozzle 85 listed herein.

As shown in FIG. 3, a splash guard assembly, generally designated 151, is supported by the docking collar 9 and comprises a splash guard 155 connected to four pulleys 159, 161 (only two of which are shown) by four cables 163, 165 (only two of which are shown) extending up from the guard. The pulleys 159, 161 are connected to a shaft 169 having a handle 173 that is accessible from outside of the docking collar 9. The handle 173 may be manually turned to rotate the shaft 169 and raise or lower the splash guard 155 during operation of the melter assembly 1. The splash guard 155 has an inverted bowl shape with an open top and bottom to allow molten silicon to pass through the splash guard. The splash guard 155 may be made from fused quartz, fused silica, silicon-carbide coated graphite, or other suitable material. The splash guard 155 is sized to fit inside the heat shield HS of the crystal puller CP so that the guard may be lowered close to the surface of the melt M in the crystal growth crucible CC as shown in phantom in FIG. 3. The splash guard assembly 151 protects the heat shield HS and other hot zone components from splashing and spraying of liquid silicon in the crystal puller CP during the transfer of liquid between the melter assembly 1 and the crystal growth crucible CC.

In use, the melter assembly 1 of the present invention efficiently melts and pours polysilicon that is received from the gravity feeder GF. The melter assembly 1 has a modular design that is designed to be easily connected to the crystal puller CP to recharge the crystal growing crucible CC with liquid silicon and then removed from the crystal puller CP for installation of the upper pull chamber PC for production of silicon ingots I. The portable design of the melter assembly 1 allows a significant cost savings by requiring only a single melter assembly that may service multiple crystal pullers CP (e.g., eight).

With an empty melting crucible 65, cooling water (not shown), electrical power (not shown), and purge gas (not shown) are connected to the melter assembly 1. Next, the gate valve GV in the lower housing LH (FIG. 2) is closed to isolate the lower housing and the upper housing UH of the crystal puller CP is removed from the lower housing and replaced with the melter assembly 1 as illustrated in FIG. 3. After tightening the flanged connection FC between the docking collar 9 of the melter assembly 1 and the lower housing LH, the melter assembly is connected to the polysilicon feeder GF. After connecting the feeder GF to the melter assembly 1, the air in the melter assembly is removed by vacuum pumping and replaced with an inert gas (e.g., argon gas) so that the pressure in the melter assembly is approximately that of the crystal puller CP (approximately 10-30 torr). After the pressure in the melter assembly 1 has been raised, the gate valve GV is opened to allow the atmosphere in the crystal puller CP to permeate the melter assembly 1.

Figure 10:
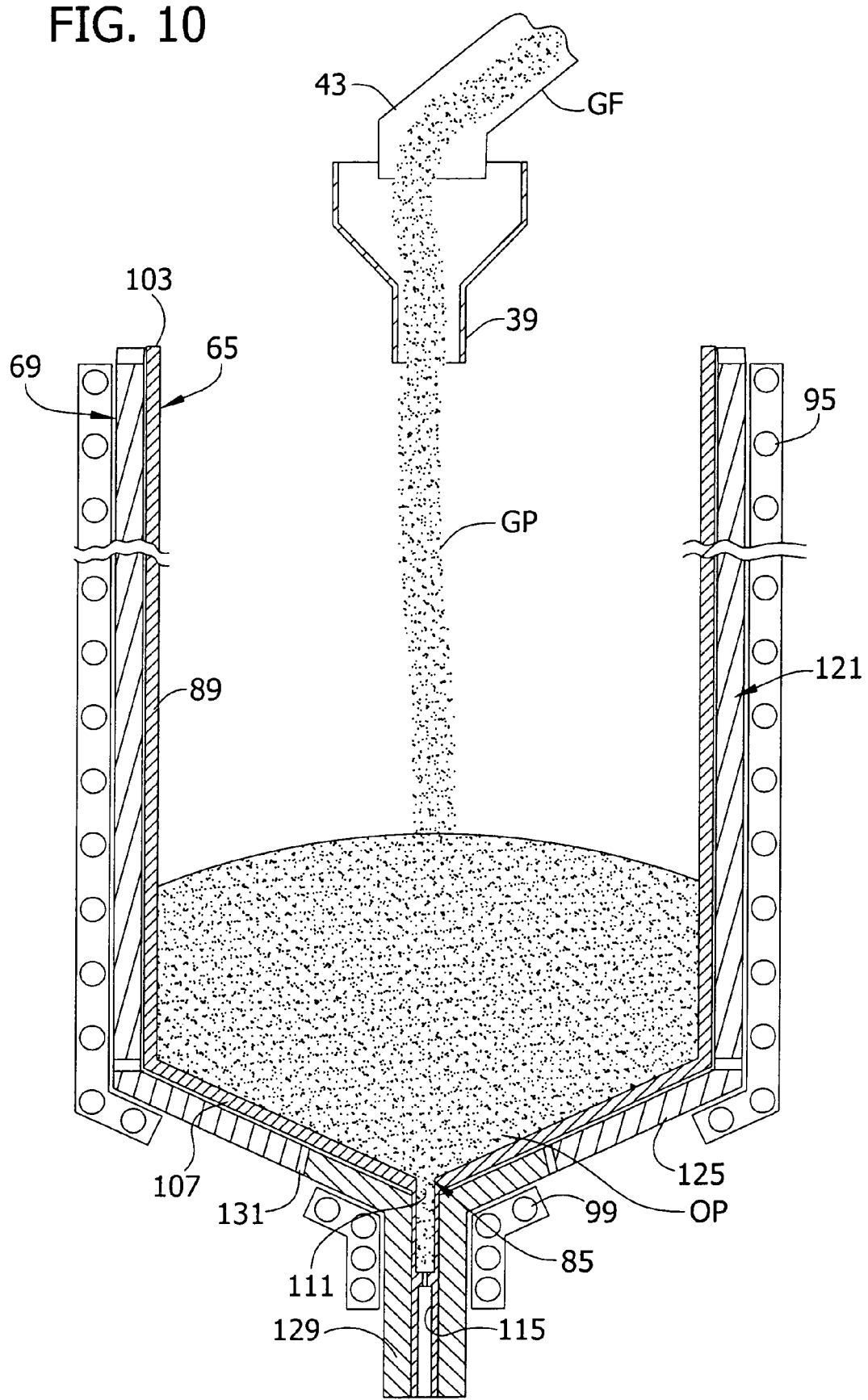
FIG. 10 is a schematic vertical section similar to FIG. 4 but showing the melting crucible being filled with solid polysilicon from a feeder.
Figure 11:
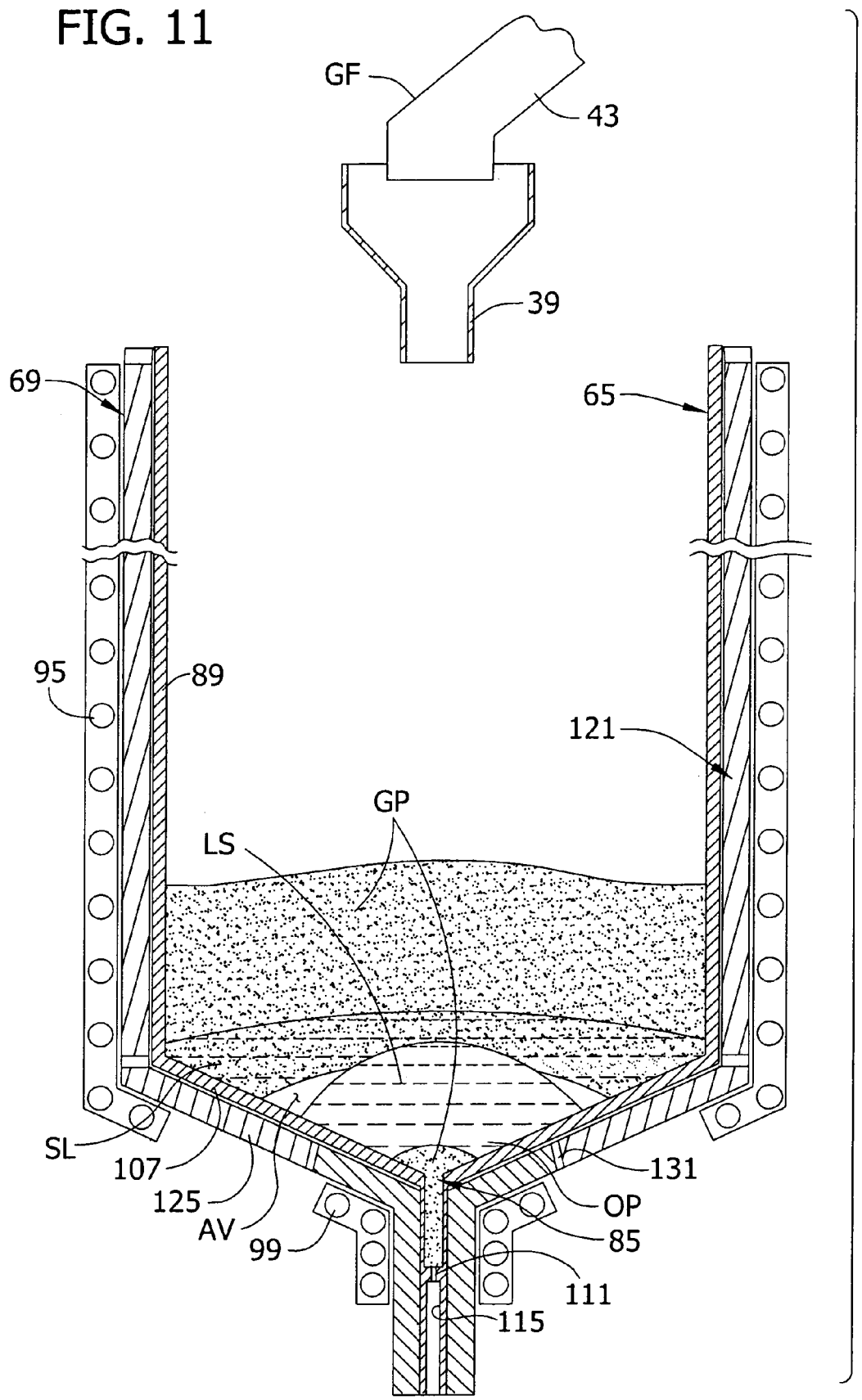
FIG. 11 is a view similar to FIG. 10 but showing initial melting of solid polysilicon in the melting crucible.
Figure 11A:
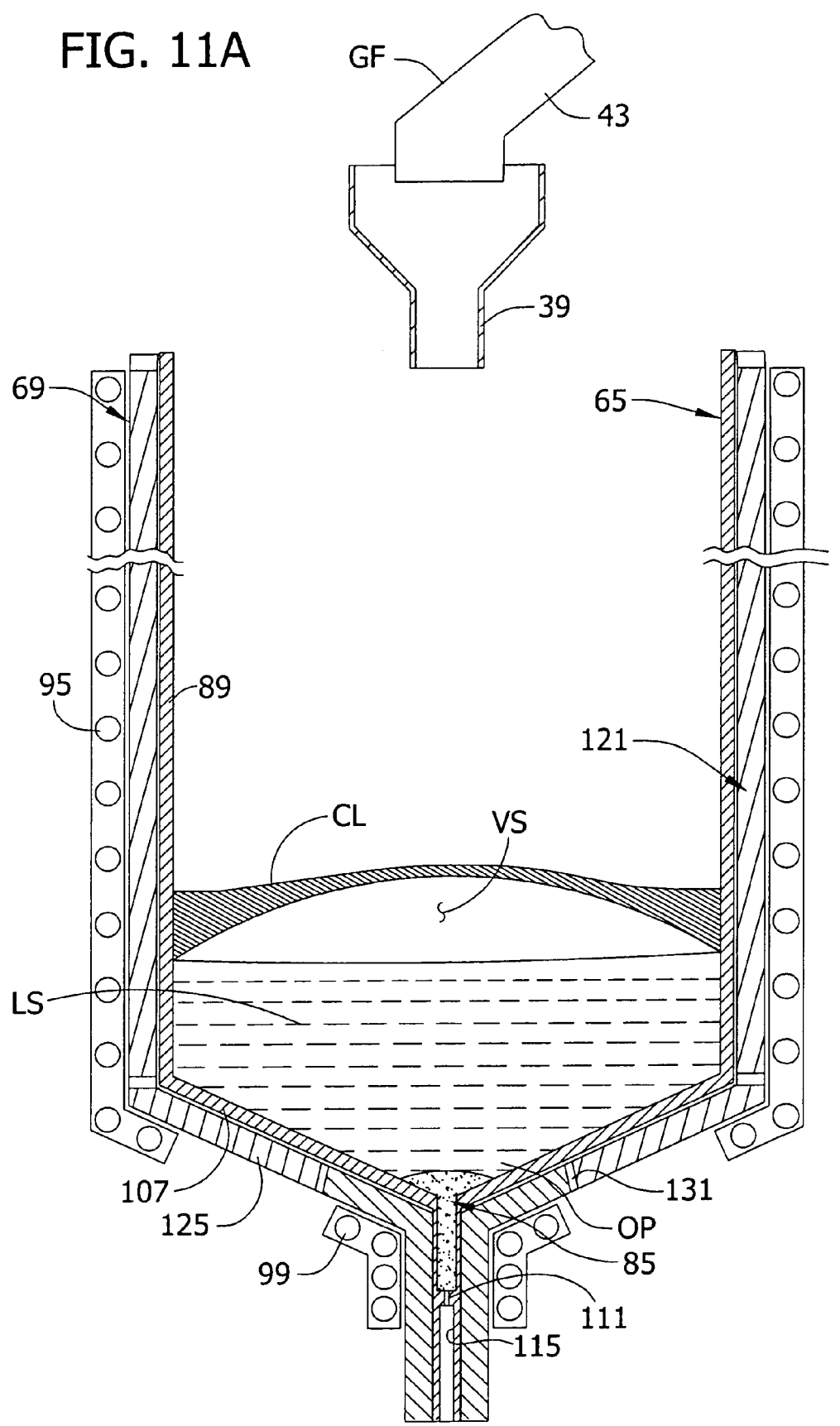
FIG. 11A is a view similar to FIG. 11 but showing further melting of the solid polysilicon in the melting crucible.
Figure 12:
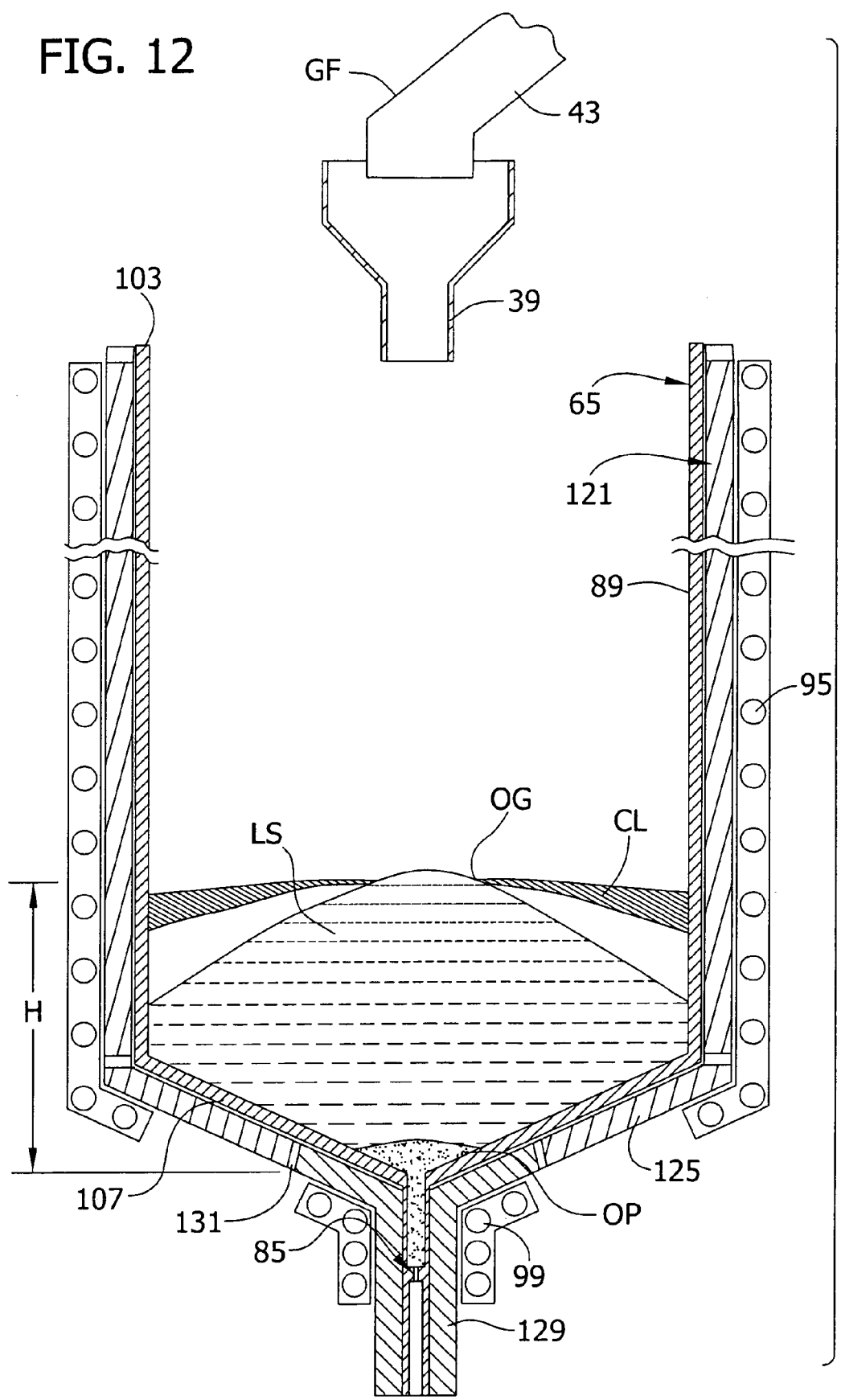
FIG. 12 is a view similar to FIG. 11 but showing still further melting of the solid polysilicon in the melting crucible.

As shown in FIG. 10, granular polysilicon GP is added to the smelter crucible 65 to provide an initial charge of approximately 4 to 7 kg (for a melting crucible having an 20 cm (8 inch) inside diameter) with the optimum mass for the initial charge of granular polysilicon for initiating melting in an 20 cm (8 inch) melting crucible 65 being about 5 kg. The power from the power supply 100 is turned on to provide 10 kW of alternating current to the upper coil 95 around the susceptor 69. As shown in FIG. 11, the initial charge of polysilicon GP in the crucible begins to melt due to the heat from the melt-in susceptor 125 and form molten silicon LS generally near the bottom of the initial charge of granular polysilicon and above an unmelted plug of solid polysilicon GP in the nozzle 85 at the bottom of the crucible 65. At the initial melting stage of FIG. 11, a top layer of unmelted polysilicon GP is separated from the molten silicon LS by an intermediate layer SL that includes a slush mixture of liquid and solid polysilicon. The intermediate layer SL is separated from the molten silicon by an annular void AV adjacent the conical wall 107 of the melting crucible 65. As the granular polysilicon GP melts the difference in density between the unmelted granular polysilicon and the liquid silicon (LS) causes the void AV in the melting crucible 65. As shown in FIG. 11A, melting in the crucible 65 continues with approximately 12-16 kW of power supplied to the coil 95 so that all of the initial granular polysilicon GP is melted to molten silicon LS except for a crust CL of solid polysilicon spaced above the top of the-molten silicon. The crust CL holds in the heat of the molten silicon LS and prevents the liquid silicon from splashing out of the crucible 65 during movement in the crucible by the induction forces from the coil 95. At this stage in the melting process, a void space VS separates the crust CL from the liquid silicon LS in the crucible. As shown in FIG. 12, an opening OG is formed in the crust by pulsing the upper coil 95 by increasing the power to the coil to approximately 60-70 kW for short time intervals (e.g., 20-30 seconds) so that the level of the liquid silicon LS is raised by the induction forces from the coil to contact and melt through the crust CL. The pulsing of the coil 95 for short time intervals continues for approximately 2 to 5 minutes until the crust CL is melted through.

Figure 13:
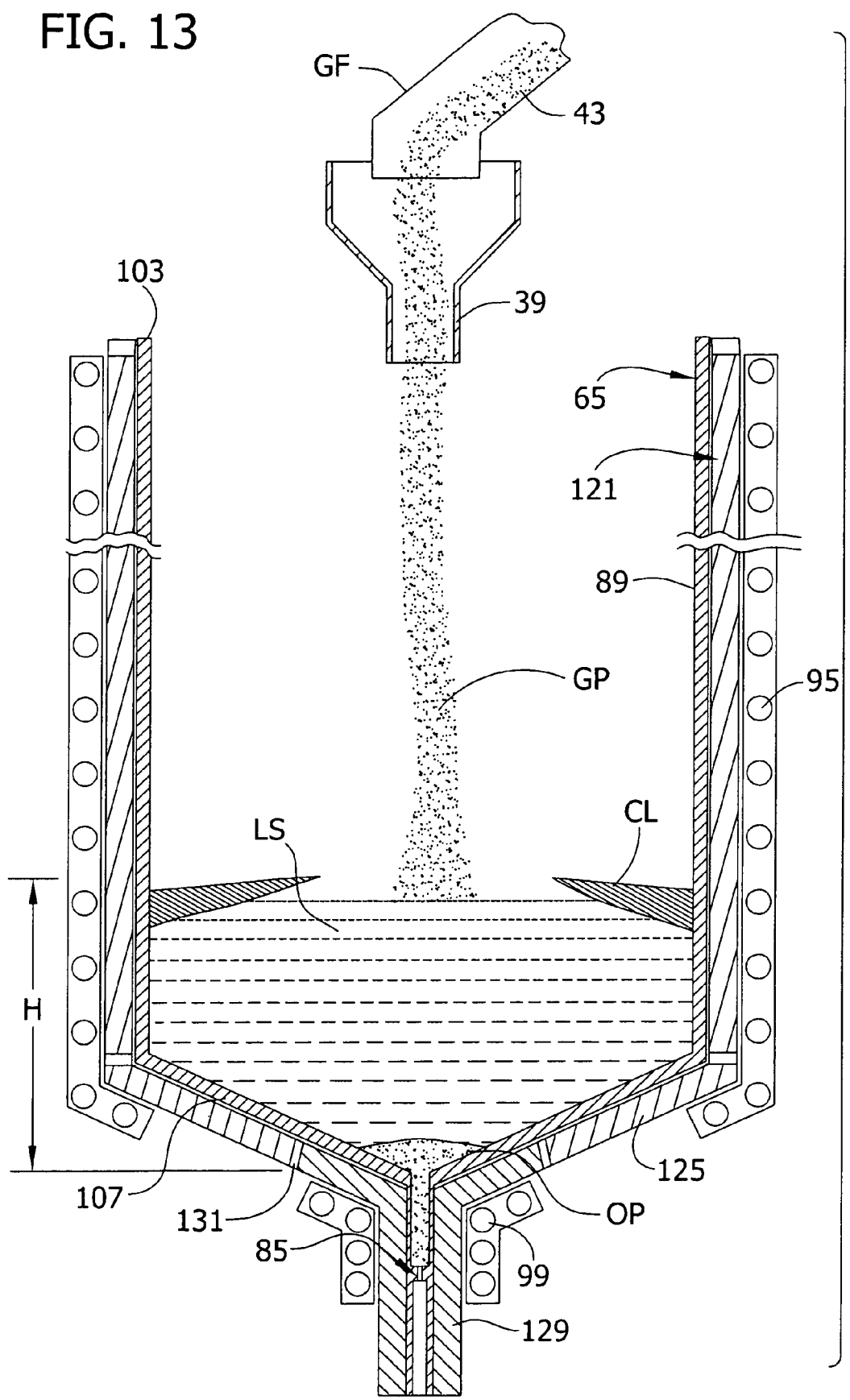
FIG. 13 is a view similar to FIG. 12 but showing the addition of solid polysilicon feed into the melting crucible.
Figure 13A:
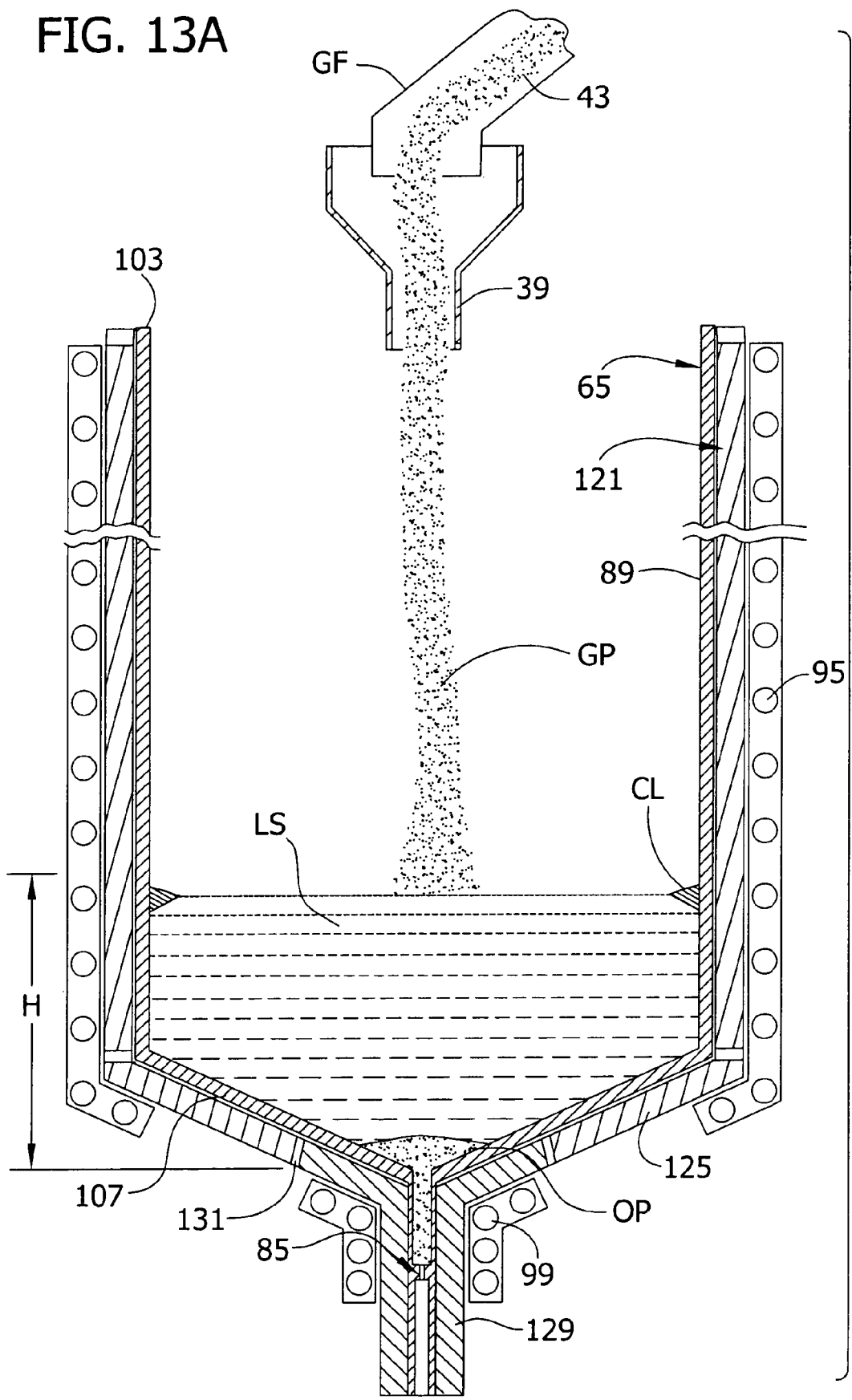
FIG. 13A is a view similar to FIG. 13 but showing further melting of solid polysilicon in the melting crucible.

After melting through the crust CL, additional granular polysilicon GP is added to the crucible 65 (FIG. 13). At this point in the melting process, the solid plug OP extending into the first portion 109 of the nozzle 85 preventing molten silicon LS from exiting the crucible 65 allows the melt height H to be raised to the desired level before the crucible is drained. As shown in FIG. 13A, granular polysilicon GP is added at approximately the maximum rate (e.g., about 70 to 85 kg/hr) to begin raising the melt height and continue melting away the remnants of the crust layer CL. At this stage, the power to the coil is increased to approximately 160 kW for a maximum flow rate of granular polysilicon GP of approximately 70-85 kg/hr. In the illustrated embodiment the melt height H (FIG. 13A) at this stage of the melting is approximately 38 mm to 89 mm (1.5 inches to 3.5 inches).

Figure 14:
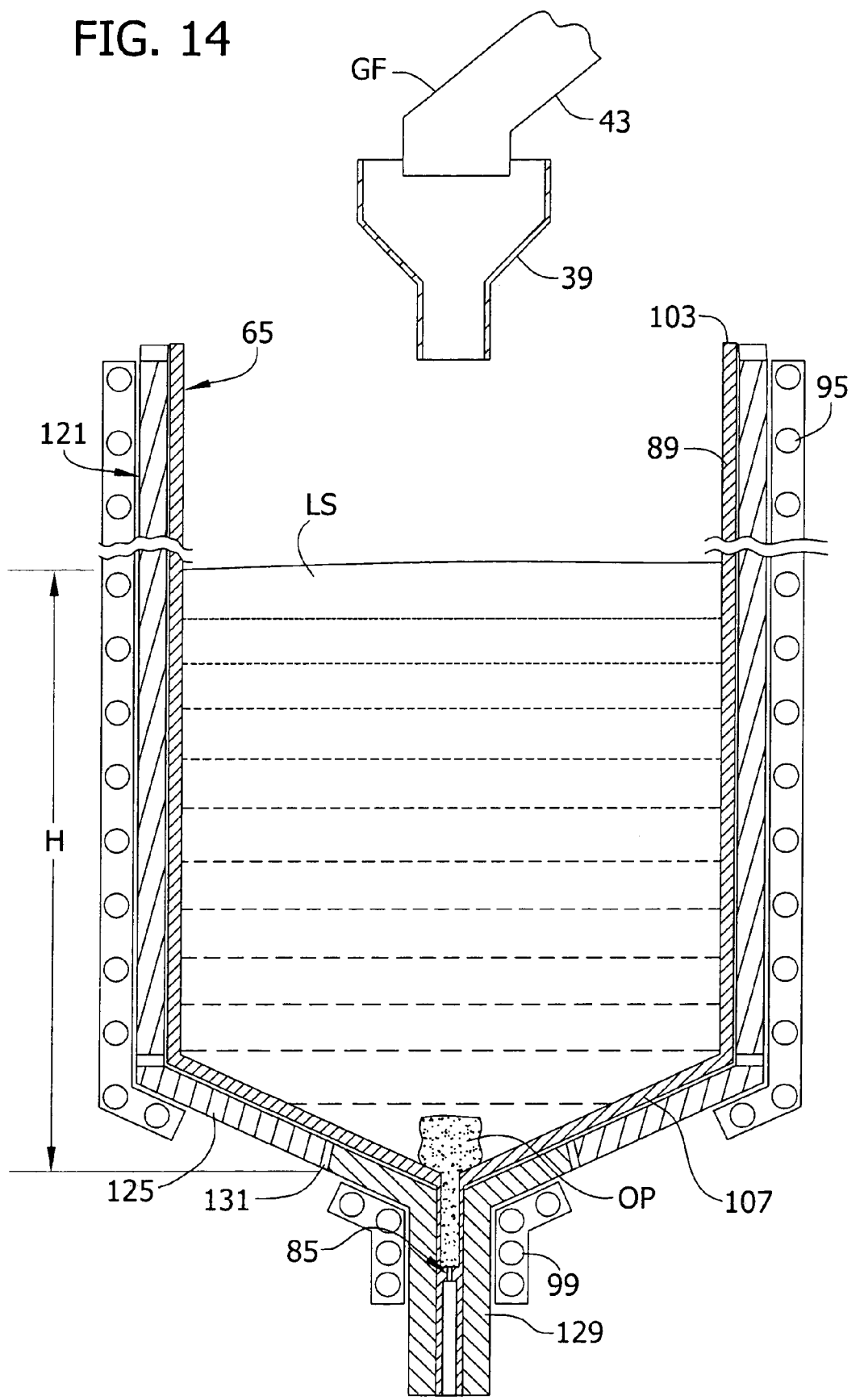
FIG. 14 is a view similar to FIG. 12 but showing further melting of the solid polysilicon in the melting crucible.
Figure 15:
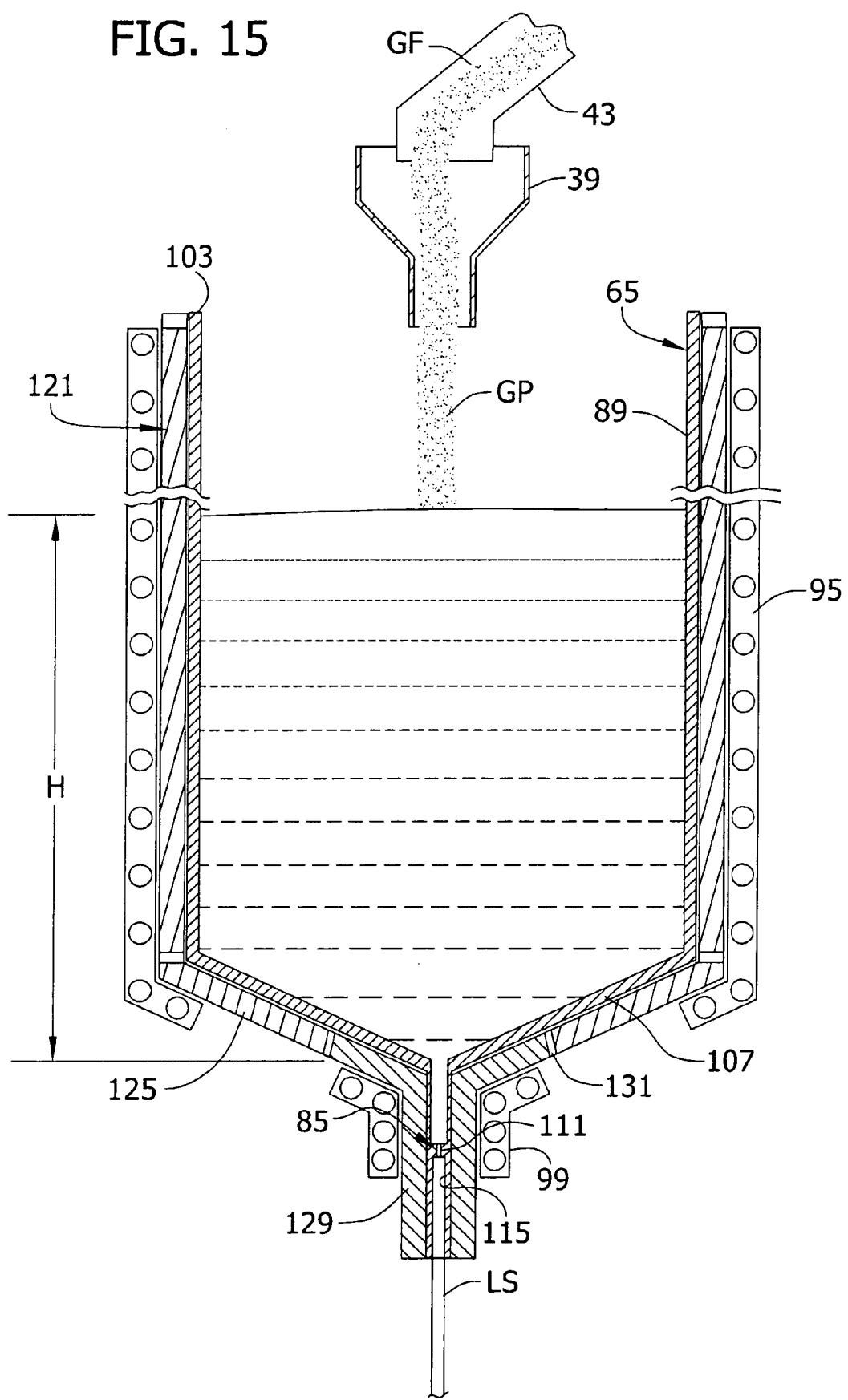
FIG. 15 is a view similar to FIG. 14 but showing liquid silicon flowing through the outlet of the melting crucible and the addition of solid polysilicon feed into the crucible.

After melting the initial charge of granular polysilicon GP, additional granular polysilicon is added to the crucible (FIGS. 13 and 13A) and melted until the melt height H (FIG. 14) is raised to approximately 250 mm (10 inches). Next, the splash guard 155 is lowered into the hot zone of the crystal puller CP and positioned in the crystal growing crucible CC generally near the surface of the silicon melt M (shown in phantom in FIG. 3). After lowering the splash guard 155 (FIG. 3), power is supplied to the lower coil 99 from the power supply 101 to raise the temperature of the bottom wall 107 of the crucible and begin melting the solid plug OP in the crucible nozzle 85 (FIG. 14). At this stage, the power supplied to the upper coil 95 is reduced to prevent the liquid silicon LS from overheating. When the solid plug OP has been melted by the induction current in the lower coil 99, molten silicon LS begins to flow from the nozzle 85 and passes through the first, second and third portions 109, 111, 115 in a directed flowstream (FIG. 15) generally aligned with the central axis of the nozzle. When liquid silicon LS begins to drain from the crucible 65 the feeder GF should be set to the target polysilicon feed rate of about 85 kg/hr. During the flow of molten silicon LS from the crucible 65, the melt height H of the liquid silicon in the crucible should be monitored and the feed rate of granular polysilicon GP adjusted accordingly to maintain the height H at the optimum level corresponding to the diameter D1 of the orifice 111. If the melt height H rises above the optimum value, the polysilicon feed rate should be reduced and if the melt height falls below the optimum value, the feed rate should be increased. While the molten silicon LS is draining from the crucible 65, the power to the upper and lower coils 95, 99 should be adjusted to maintain the optimum amount of superheat (e.g., at least approximately 20 degrees C.) of the liquid silicon exiting the crucible nozzle 85.

Figure 16:
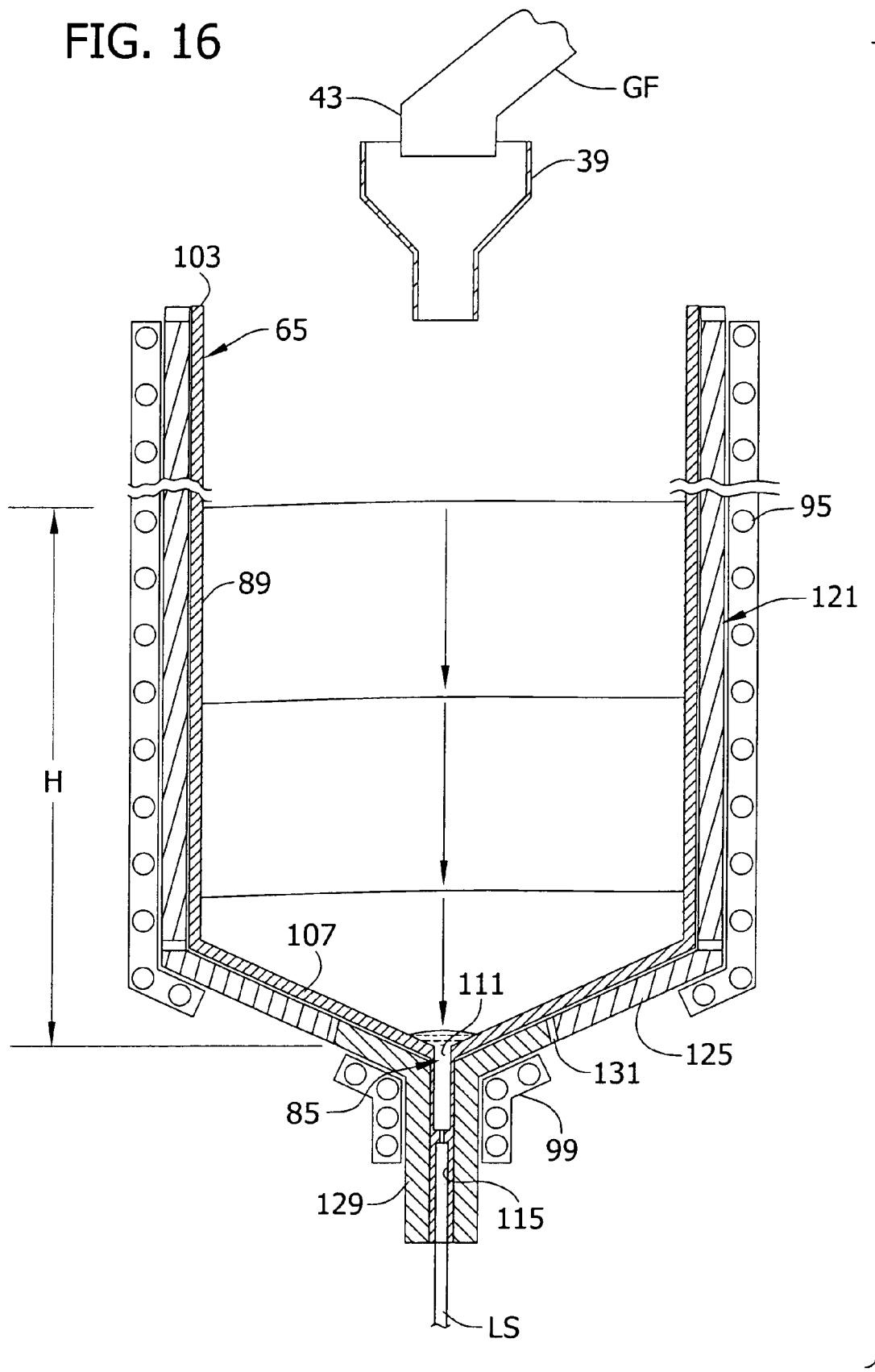
FIG. 16 is a view similar to FIG. 15 but showing the reduction in melt height in the melting crucible.

Once the target amount of granular polysilicon GP has been delivered from the feeder GF, the granular polysilicon feed is turned off and power to the upper coil 95 reduced to approximately 12 kW. At this stage, the crucible 65 is drained (FIG. 16). If needed, purge gas (e.g. argon gas) can be added to the melter assembly to increase the pressure in the assembly and force any remaining silicon out of the crucible nozzle at an appropriate rate. As the melt height H in the crucible 65 drops, the mass flow rate of liquid silicon LS passing through the outlet 85 of the crucible is reduced. The purge gas can be used to pressurize the remaining liquid silicon LS in the crucible 65 so that the liquid silicon flows out the nozzle 85 of the crucible at a sufficient velocity to maintain a flow stream generally directed along the central axis of the nozzle. It has been determined that approximately 2 torr (0.04 psi) of pressure differential between the melter assembly 1 and the crystal puller CP is preferable for approximately every 10 mm (0.4 inch) reduction in melt height H to maintain the desired mass flow rate of liquid silicon LS. After completely draining the melter of all liquid silicon LS, power to the upper and lower coils 95, 99 may be turned off and the splash guard 155 raised into the docking collar 9. The gate valve of the lower housing LH is closed to isolate the growth chamber GC. Next, the melter assembly 1 is filled with air at ambient pressure in order to oxidize the silicon oxide present in the melter assembly and prevent uncontrolled burning of silicon oxide upon disconnection of the melter assembly from the crystal puller. After filling the melter assembly 1 with air, the assembly can be disconnected from the crystal puller CP and stored between melting and draining cycles or the assembly may be immediately prepped for recharging another crystal puller. After removing the melter assembly 1, the upper housing UH of the crystal puller CP can be replaced and the puller prepared to produce silicon ingots I from the melt M.

The operation of the melter assembly 1 of the present invention results in a total melting and fill time of the polysilicon source material in the crystal growing crucible CC of the crystal puller CP of approximately five to five and one-half hours. The fill and melting time of the conventional melting pool preparation in the crystal growing crucible CC of the crystal puller CP takes approximately 18 hours for a 250 kg (551lbs) charge. The significant time savings by using the melter assembly 1 of the present invention significantly increases the ingot I production of each crystal puller CP filled by the melter assembly 1. Also, because the melting of polysilicon is isolated in the melting assembly 1 and does not take place in the hot zone of the crystal puller CP, less expensive, non-dehydrogenated polysilicon source material may be used because the splashing and spraying from adding polysilicon having a higher amount of hydrogen is contained in the melter assembly.

Figure 29:
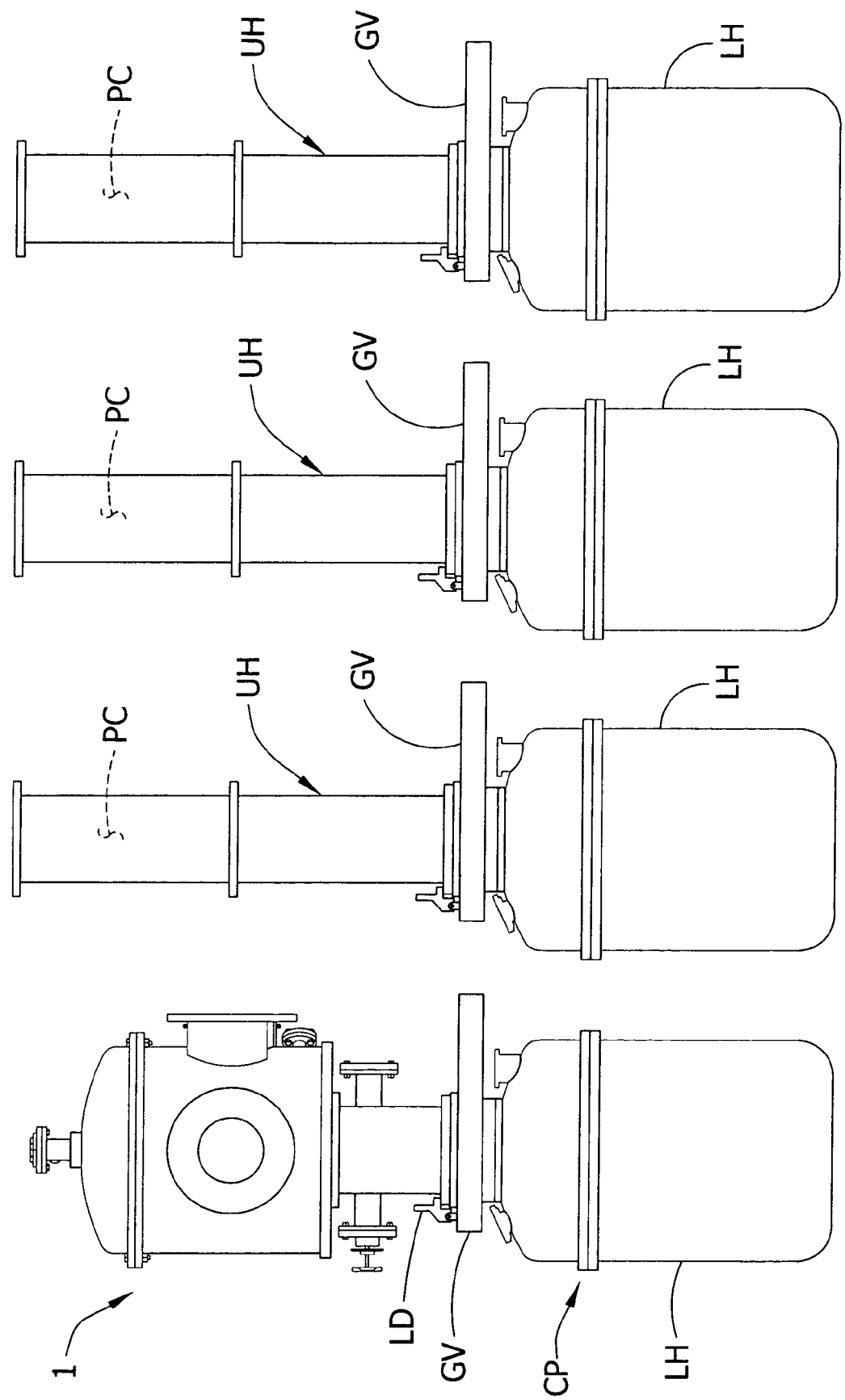
FIG. 29 is a schematic of a melter assembly positioned for servicing a first crystal puller in a series of crystal pullers.

As shown in FIG. 29, the melter assembly 1 of the present invention may be used to service multiple crystal forming apparatus (e.g., crystal pullers CP). The melter assembly 1 may be operated as discussed above to deliver a charge of molten source material LS to the crystal puller CP and then moved by a lifting mechanism (not shown) and installed on an adjacent crystal puller. Four crystal pullers CP are shown positioned for service by the melter assembly 1, but it is understood that the melter assembly could service more or less than four crystal pullers without departing from the scope of this invention.

The melter assembly 1 is first positioned relative to the first crystal puller CP and is operated as described above to deliver molten silicon LS to the crucible CC of the first crystal puller. As described above, the upper and lower induction coils 95, 99 of the heater are operated to melt source material in the melting crucible 65 and deliver a stream of molten source material that flows through the nozzle 85 of the melter assembly 1 to the main crucible CC of the first crystal puller CP. After servicing the first crystal puller CP, the upper housing UH of the second crystal puller that encloses the pull chamber PC is removed and the melter assembly 1 is positioned above the gate valve GV isolating the lower housing LH of the second puller. The melter assembly 1 may be positioned relative to the first and second crystal pullers CP by a crane (not shown) or other lifting mechanism. The crane may be used to raise the melter assembly 1 above the first crystal puller CP so that the melter assembly may be transferred to a position above the second crystal puller. After positioning the melter assembly 1 relative to the second crystal puller CP, the melter assembly is connected to the lower housing LH of the second crystal puller. After connecting the melter assembly to the crystal puller, the melter assembly is operated to deliver a stream of molten source material to the second crystal forming apparatus. It is understood that the method of servicing multiple crystal forming apparatus could be applied to any embodiment of crystal forming apparatus described herein or any other crystal forming apparatus without departing from the scope of this invention. Further, it is understood that after completion of the melt and fill cycle, the melter assembly 1 may remain stationary and the crystal puller CP may be moved relative to the melter assembly and replaced with the second crystal puller. It is understood that the crystal puller may be used to service more or less than four crystal pullers CP that are illustrated in FIG. 29.

Figure 17:
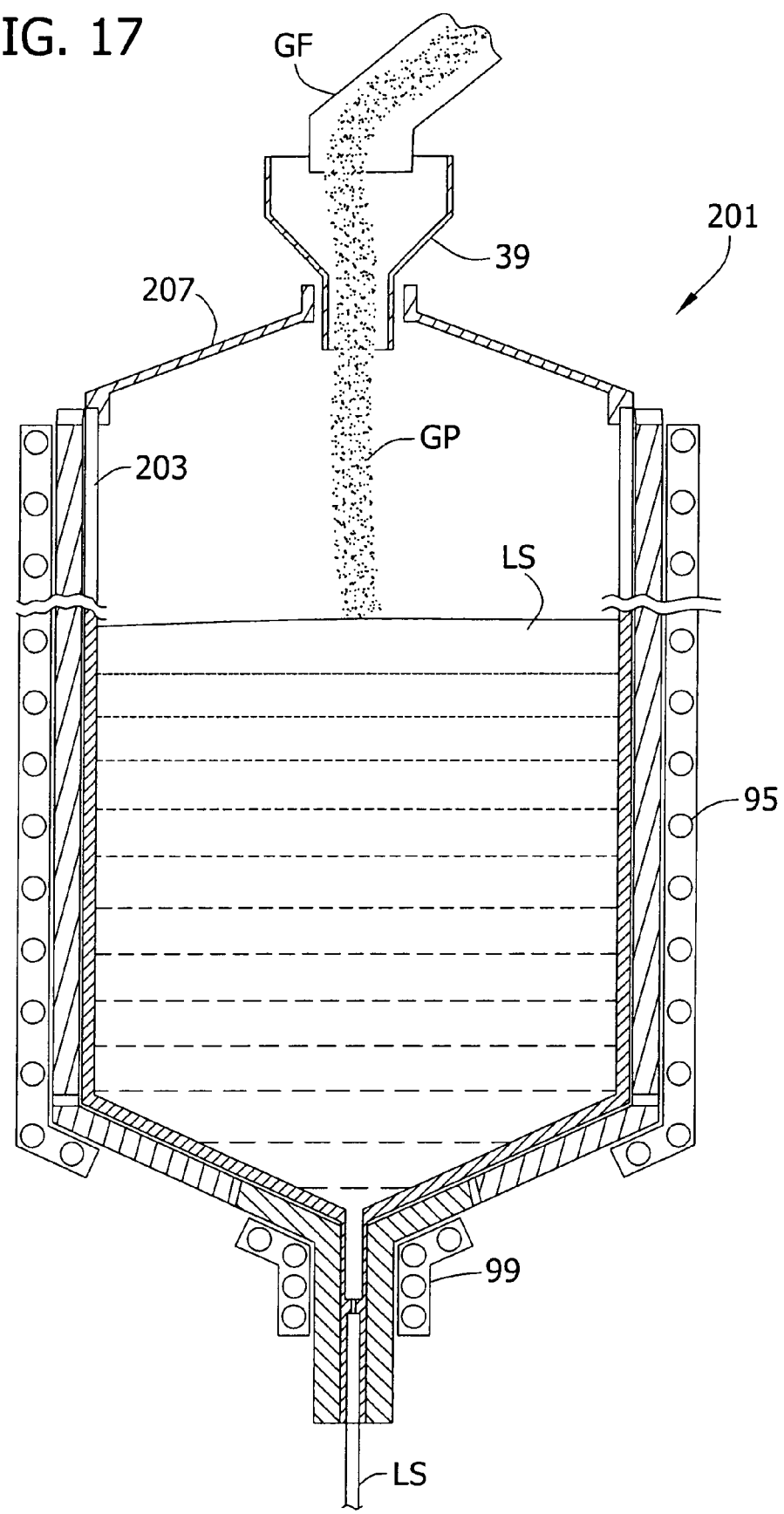
FIG. 17 is a view similar to FIG. 15 but showing an alternate embodiment of the melting crucible.

As shown in FIG. 17, another melting assembly is shown, generally indicated 201, that is substantially similar to the melting assembly 1 of the first embodiment. The melting assembly 201 of FIG. 17 includes a melting crucible 203 with a closed top wall 207. The closed top wall 207 of the melting crucible 203 contains splatter that may occur when granular polysilicon GP is added to the molten silicon LS in the crucible. Also, the top wall 207 contains polysilicon dust that is created when the granular polysilicon GP is loaded into the melting crucible 203.

Figure 18:
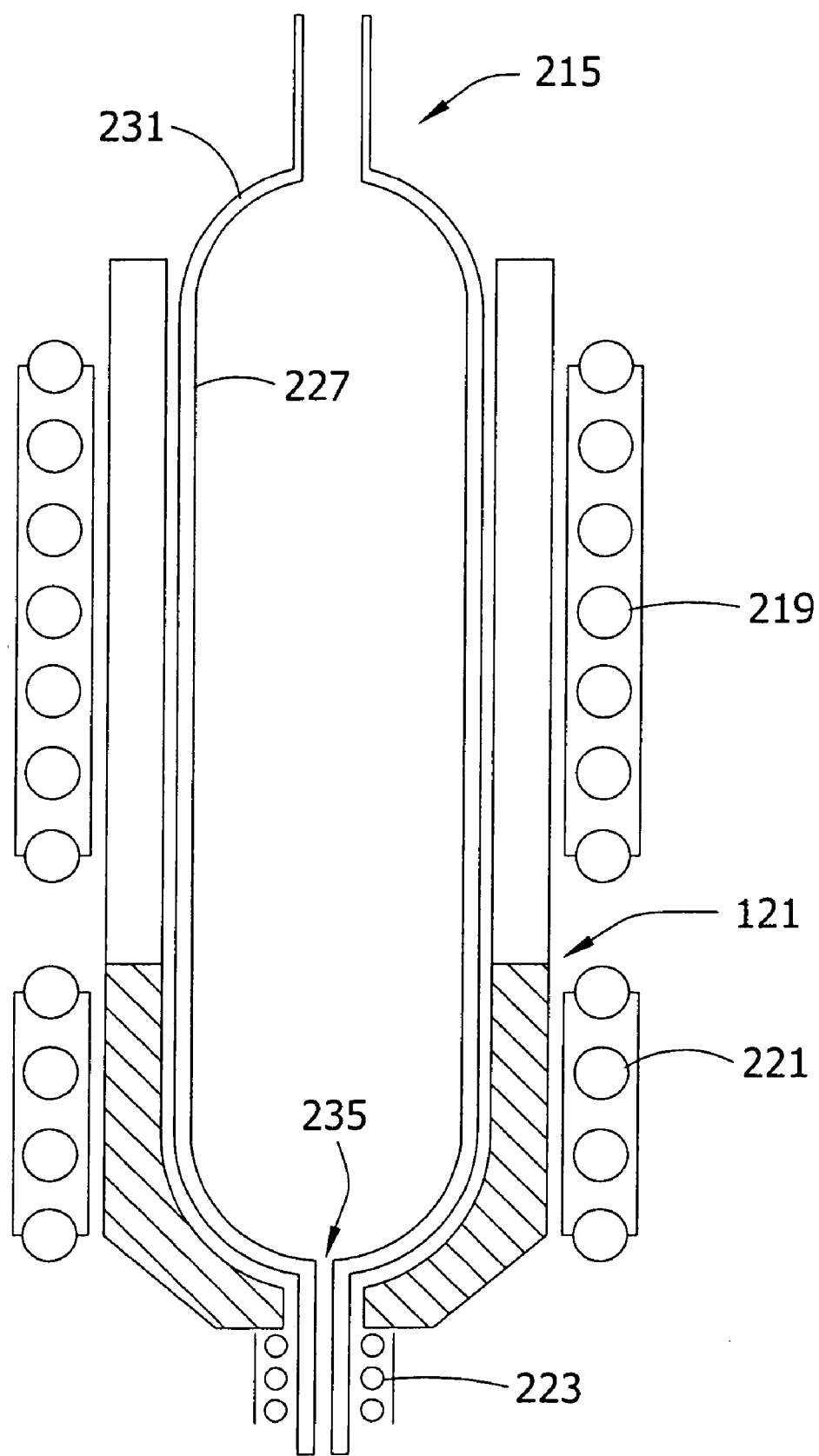
FIG. 18 is a schematic section of a melter assembly of another embodiment of the present invention.

FIG. 18 shows yet another embodiment of the melting assembly, generally indicated 215, that includes an upper coil 219, an intermediate coil 221, and a lower coil 223 for supplying induction current to melt the solid polysilicon GP. This design also includes a melting crucible 227 with a closed top wall 231 as in the previous embodiment, but it will be understood that this design may be incorporated to the open-top crucible design without departing from the scope of this invention. The three-coil configuration of this embodiment allows temperature regulation of the melt by control of the current supplied to the upper coil 219, intermediate coil 221, and lower coil 223. Each of the coils 219, 221, 233 is separately connected to its own power supply for independent control of the current passing through each coil. The amount of heating power generated by each of the three coils 219, 221, 223 may be independently regulated.

The addition of the separate intermediate coil 221 of this design allows the heat of the silicon melt in the middle portion of the crucible 227 to be independently regulated by adjusting the current flowing through the intermediate coil. The separate lower coil 223 of this design allows the heat of the silicon flowing through the outlet 235 to be independently regulated by adjusting the frequency of the current flowing through the lower coil. Also, the lower coil 223 can be used to create a magnetic field in the outlet 235 that restricts the flow of silicon to a smaller diameter than the inner diameter of the outlet 235. The reduction of flow stream diameter passing through the outlet 235 allows further control of melt flow rate from the crucible 227 and reduces the rate of ablation of the outlet as a result of the reduced contact between the liquid silicon passing through the outlet and the inner surface of the outlet.

Figure 19:
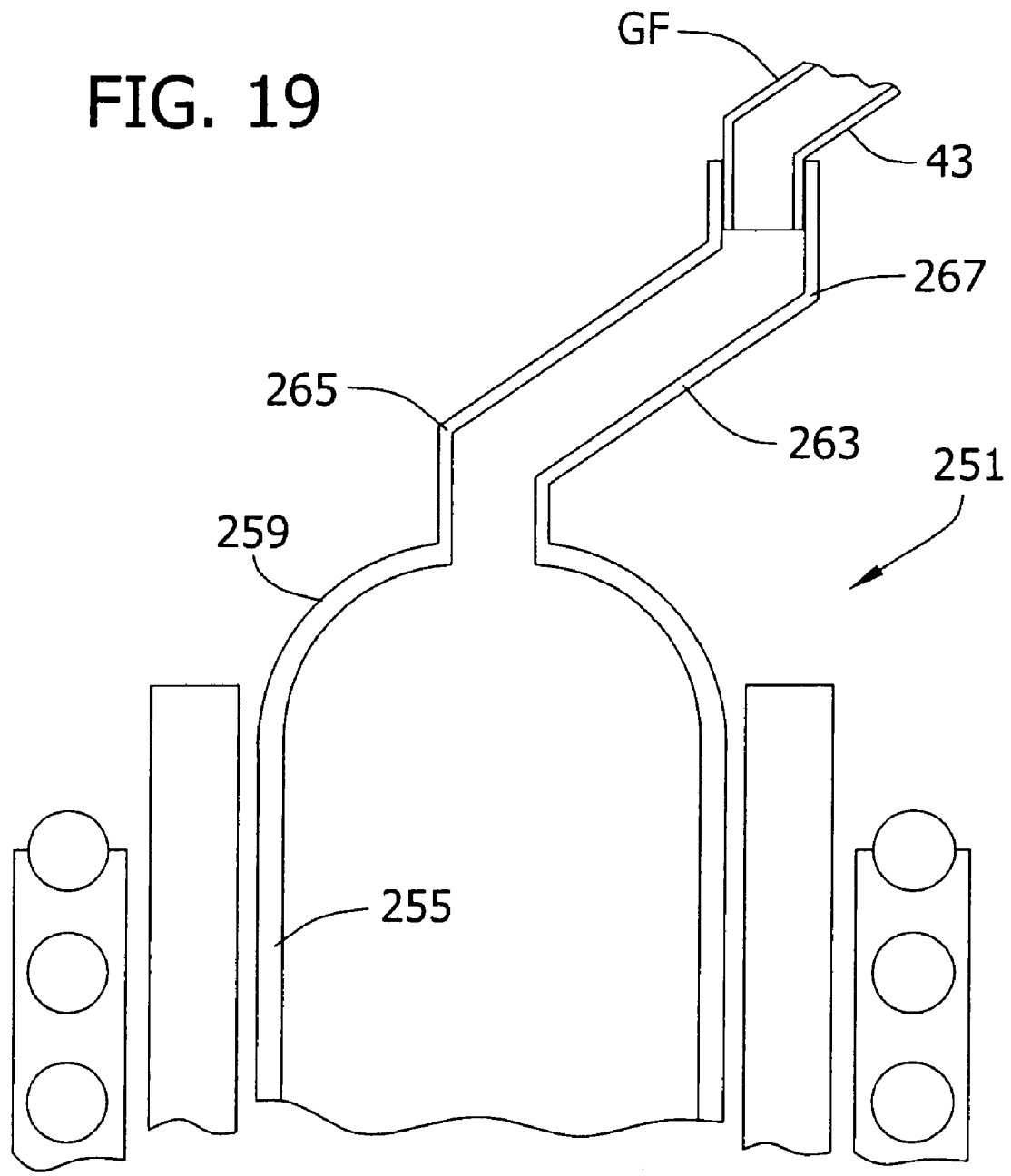
FIG. 19 is a enlarged, fragmentary schematic section of a melter assembly of another embodiment of the present invention.

FIG. 19 shows a further embodiment of the melter assembly, generally indicated 251, that includes a crucible 255 having a closed top wall 259 with a polysilicon feed inlet 263 having two 45-degree bends 265, 267 for accommodating the outlet of the gravity feeder GF. This design contains both polysilicon dust that is generated from transferring the solid polysilicon to the crucible and the melt splatter that frequently occurs when the polysilicon impinges the melt in the crucible. The two bends create a tortuous path inhibiting splatter polysilicon from reaching the gravity feeder. Also, the two bend accommodate a gravity feeder that is offset from the centerline of the melter assembly so that the feeder can be connected to the melter assembly from a different position of the feeder.

Figure 20:
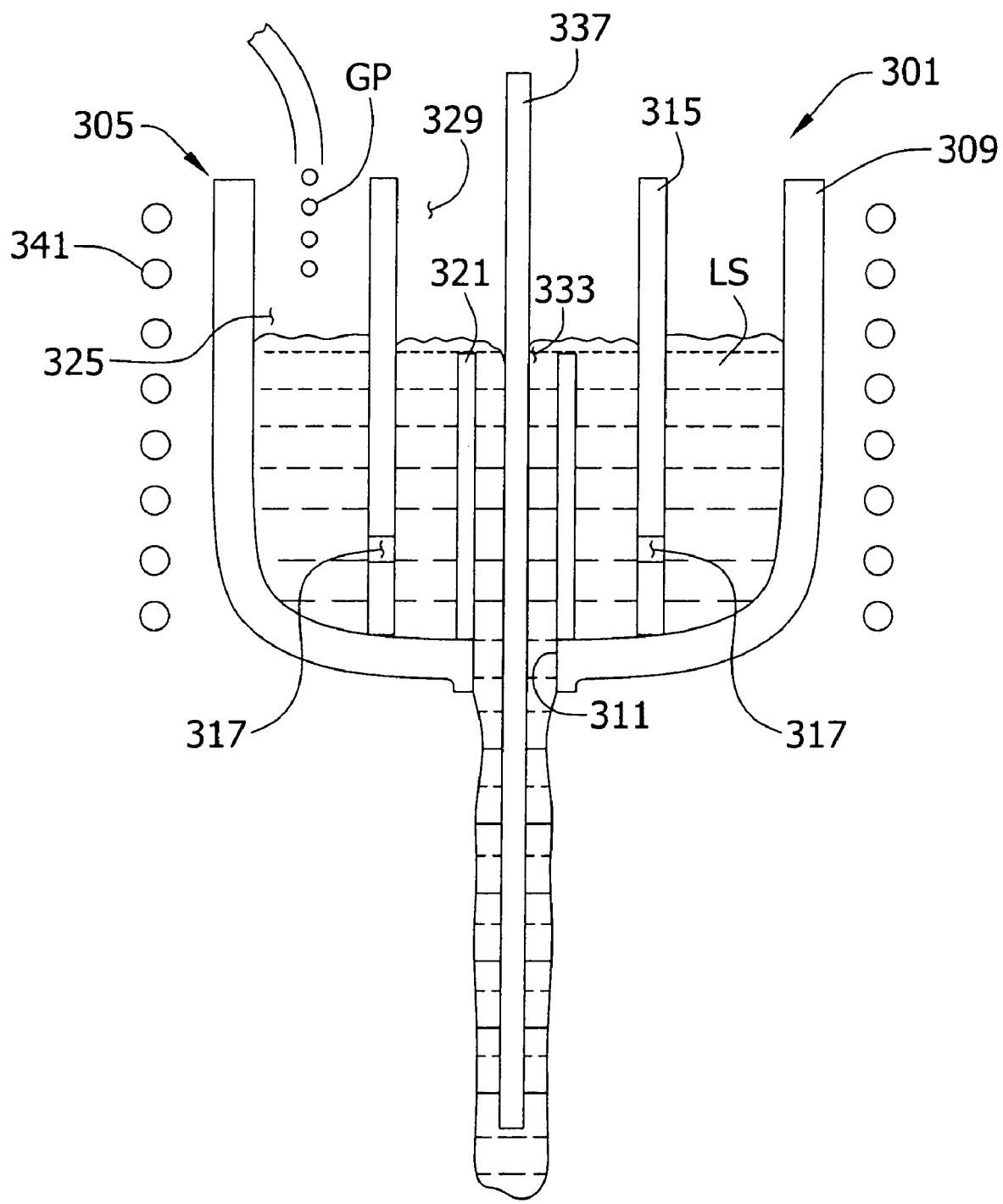
FIG. 20 is a schematic of a melter assembly of another embodiment of the present invention.
Figure 21:
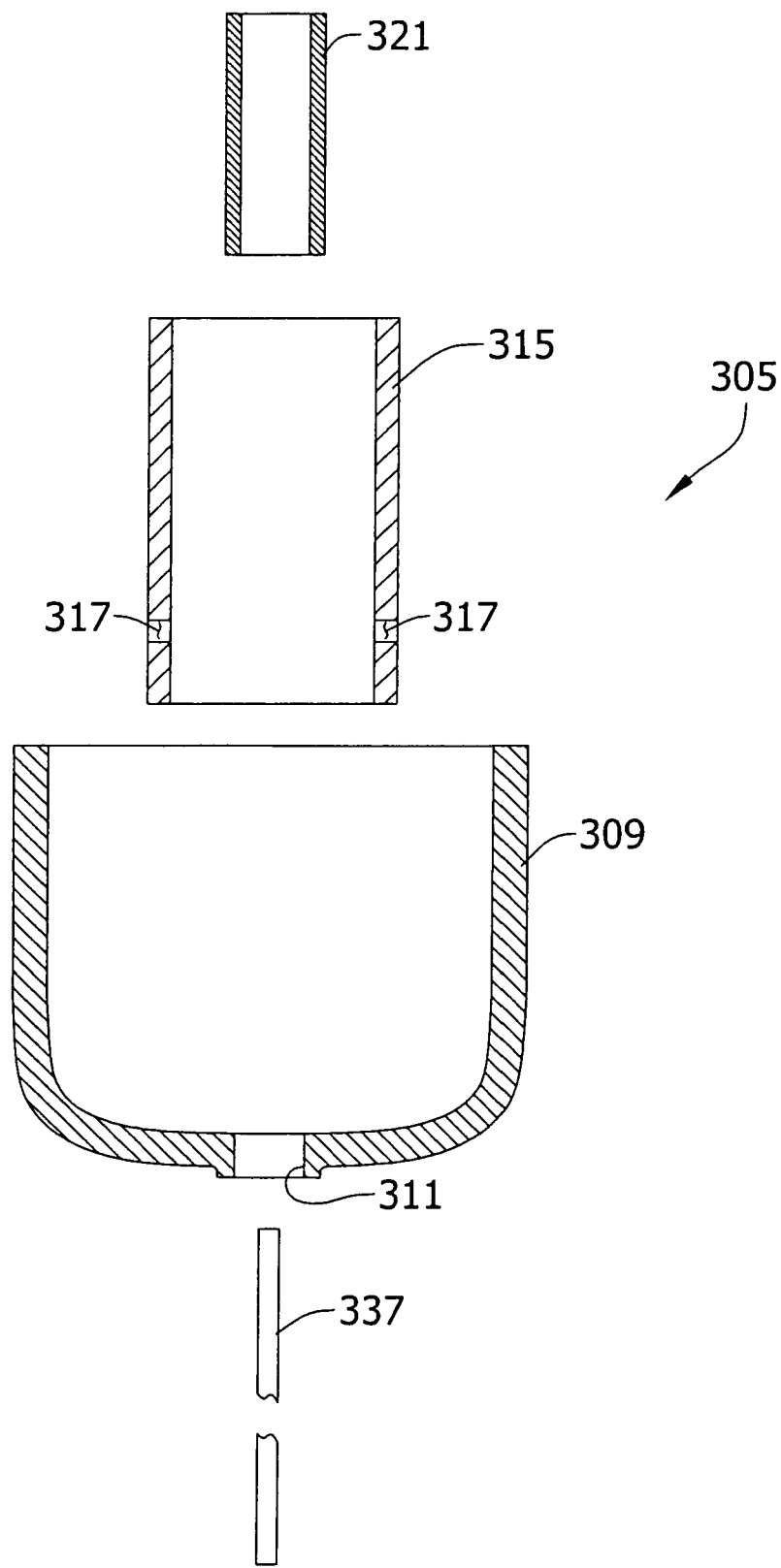
FIG. 21 is an exploded section of a the melting crucible of the embodiment of FIG. 20.

FIGS. 20 and 21 show yet another embodiment of the melter assembly, generally indicated 301, that includes a crucible, generally indicated 305, having multiple chambers. The crucible 305 comprises an outer bowl 309 having a bottom nozzle 311, a filter cylinder 315 welded to the outer bowl and having ports 317 (only two of which are shown) for the inflow of molten silicon LS, and an inner cylinder weir 321 sized to correspond with the size of the bottom nozzle. The weir 321 is shorter than the bowl 309 and filter cylinder 315 and surrounds the nozzle 311 so that liquid silicon LS inside of the cylindrical weir exits the nozzle of the crucible 305. The melting crucible 305 of this design has a melting chamber 325 defined by the space between the bowl 309 and the filter cylinder 315, a control chamber 329 between the filter cylinder and the weir 321, and a drain chamber 333 defined by the space inside the cylindrical weir 321.

Figure 21A:
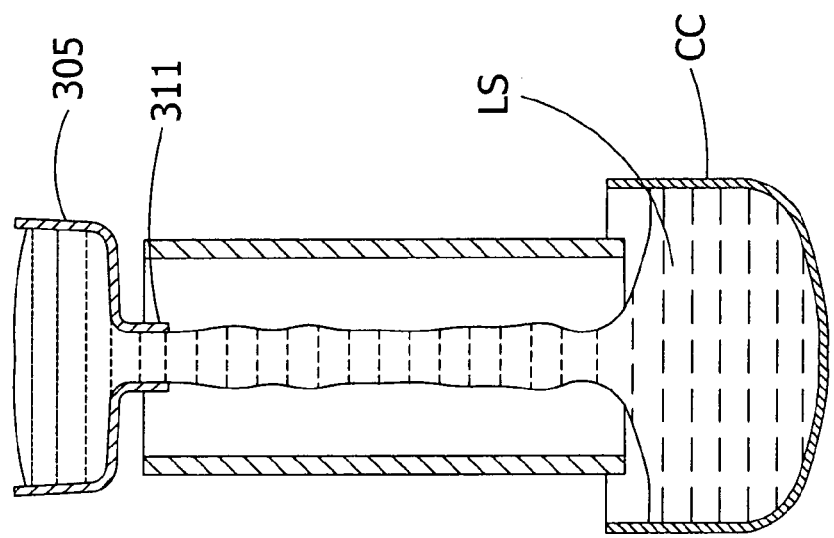
FIG. 21A is a schematic section of one version of a melt flow guide.

The nozzle 311 may be constructed as describe above for nozzle 85 and may be used in combination with a resistance heated melt flow guide 337. The flow guide 337 controls the flow of liquid silicon from the melting crucible 305 by directing the flow from the melting crucible along the outer surface of the flow guide and into the growth crucible CC. In the embodiment of FIGS. 20 and 21A, the melt flow guide 337 is in the form of a fused quartz tube that is received through the nozzle 311 of the outer bowl 309 and is axially aligned with the drain chamber 333. The melt flow guide 337 has a heating element 339 on the inside of the tube that maintains the flow guide at a temperature approximately equal to or slightly above the melting point of silicon (approximately 1414 degrees C.). As shown in FIG. 21A, the flow guide 337 extends down into the crystal growing crucible CC of the crystal puller CP (FIG. 2) and facilitates the flow of molten silicon from the melting assembly 301 to the crystal puller so that splashing and spraying in the crystal growing crucible is reduced The flow guide 337 may be made of any suitable material (e.g., fused silica, fused quartz, silicon-carbide coated graphite, etc.) without departing from the scope of this invention. The heating element 339 may be an electric resistance heating element for use with a molybdenum, tungsten, or graphite resistance heater. Alternatively the flow guide 337 may be heated by induction heating with a molybdenum, tungsten, or graphite susceptor.

Figure 21B:
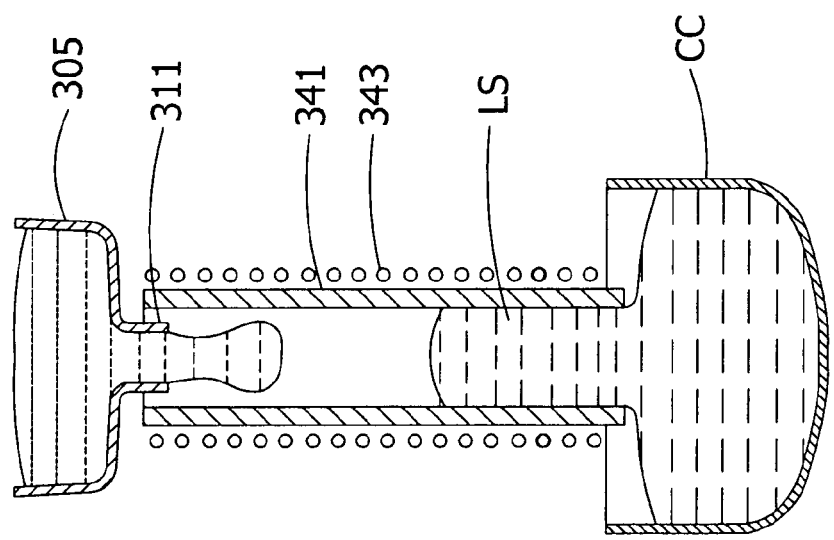
FIG. 21B is a schematic section of a second version of the melt flow guide.

FIG. 21B shows a modified version of the flow guide 341 in the form of a tube that receives the nozzle 311 of the melting crucible 305. The flow guide 341 has a heating element 343 on the outside of the tube so that molten silicon LS flows from the nozzle 311 into the tube. As with the previous version, the flow guide 341 directs the flow of molten silicon LS from the melting crucible 305 to the growth crucible CC of the crystal puller CP (FIG. 2). As with the previous embodiment, the flow guide 341 may be heated by resistance heating, induction heating, or any other heating method.

Figure 21C:
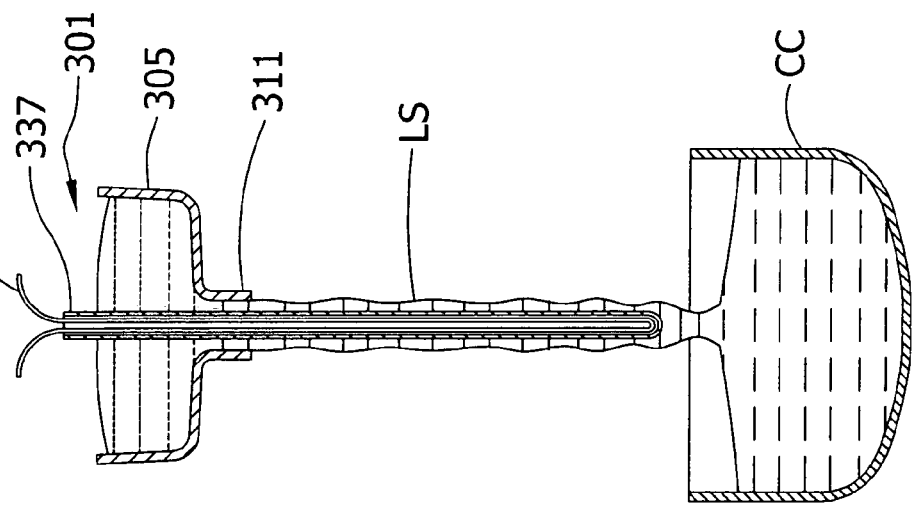
FIG. 21C is a schematic section of a third version of the melt flow guide.

FIG. 21C shows another version of the flow guide 345 that receives the nozzle 311 of the melting crucible 305. The flow guide 345 is sized such that a coherent stream of molten silicon LS flowing from the nozzle does not contact the wall of the flow guide. Since the molten silicon does not contact the wall of the flow guide 345, the guide does not have a heating element as with the previous versions. The flow guide 345 prevents liquid silicon LS from the growing crucible CC from contacting the hot zone components of the crystal puller when the flow stream from the nozzle 311 enters the pool of liquid silicon in the growing crucible.

In the design of FIGS. 20 and 21, granular polysilicon GP is added to the melt chamber 325 and the polysilicon is melted in a similar manner as discussed above for the first embodiment (i.e., induction heating by induction coils 341 around the crucible 305). As the granular polysilicon GP melts in the melting chamber 325, molten silicon LS flows through the ports 317 in the filter cylinder 315 and fills the control chamber 329 of the crucible 305. Once the level of molten silicon LS in the control chamber 329 reaches the height of the cylindrical weir 321, molten silicon flows over the top of the weir and begins to exit the nozzle 311 of the crucible 305. The molten silicon LS contacts the flow guide 337 and flows down to the crystal growing crucible CC at a slow, controlled speed and in a direction generally axially aligned with the nozzle 311 to minimize disturbances on the surface of the melt M in the crucible. In this way, the melter assembly 301 supplies a controlled flow of molten silicon LS to the crystal growth crucible CC in a manner that reduces splashing of liquid silicon onto the hot zone parts of the crystal puller CP. The ports 317 in the filter cylinder 315 are located below the surface of the liquid silicon LS so that any unmelted silicon that may be floating in the liquid silicon is not allowed to pass from the melting chamber 325 to the control chamber 329 of the assembly 301.

Figure 22:
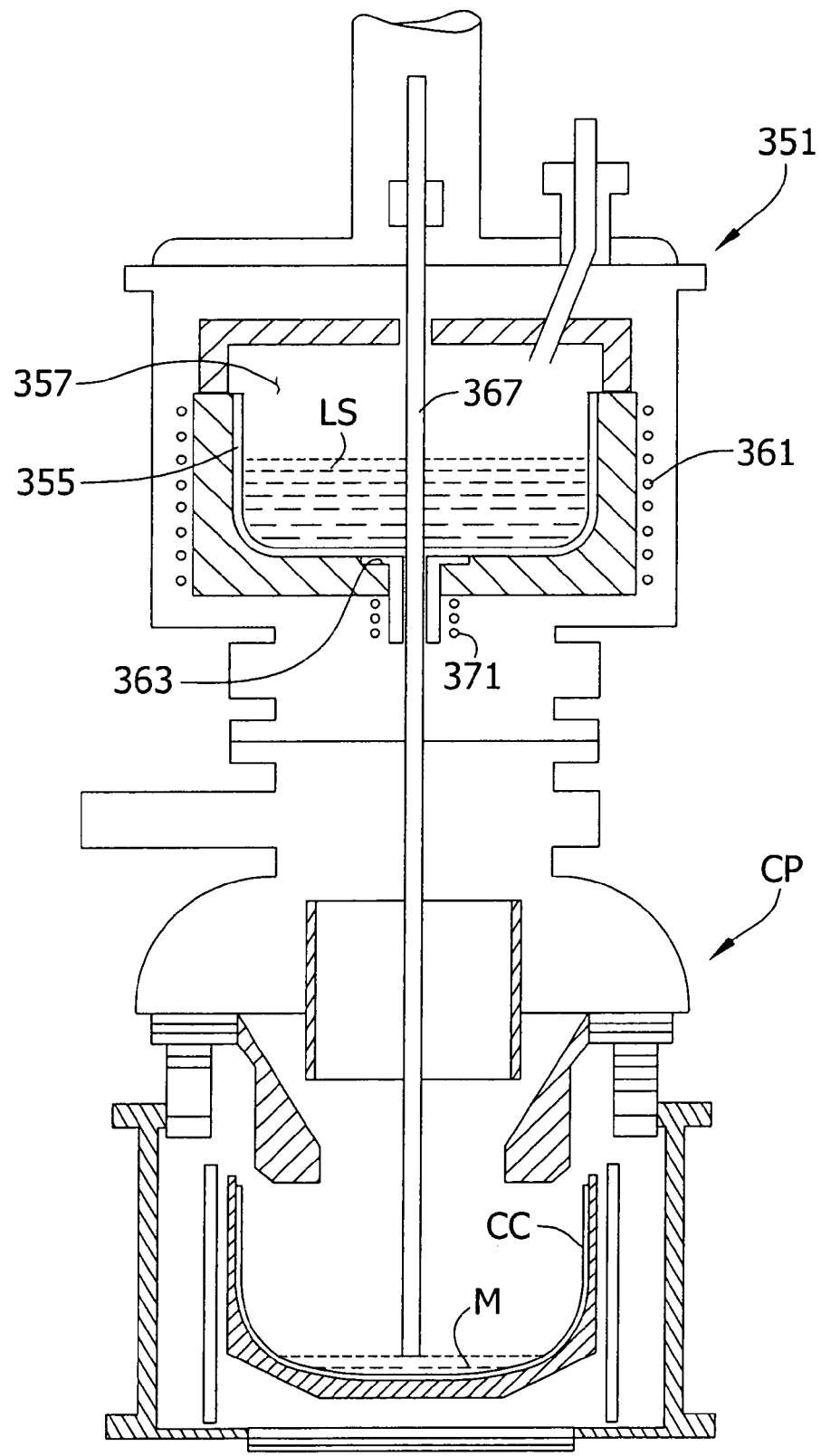
FIG. 22 is a schematic section of another embodiment of a melter assembly shown installed on a crystal forming apparatus.

FIG. 22 shows a melter assembly, generally designated 351 similar to the previous embodiment except that the melter assembly of this embodiment includes a melting crucible 355 having only a single internal chamber 357. The crucible 355 is surrounded by a melting induction coil 361 for melting polysilicon in the crucible. The outlet 363 of the crucible 355 receives a melt guide 367 and is surrounded by a lower induction coil 371 for the flow of alternating electrical current from a power supply (not shown). The lower induction coil 371 (also referred to as a levitation valve) serves as a nozzle valve that controls the flow of liquid silicon LS out of the crucible 355. When the current is flowing through the lower induction coil 371, the magnetic field induced in the flow path of liquid silicon LS is strong enough to block the flow of liquid silicon from the crucible 355. The flow of liquid silicon LS from the crucible 355 is controlled by turning on and off the current supplied to the lower induction coil 371.

Figure 23:
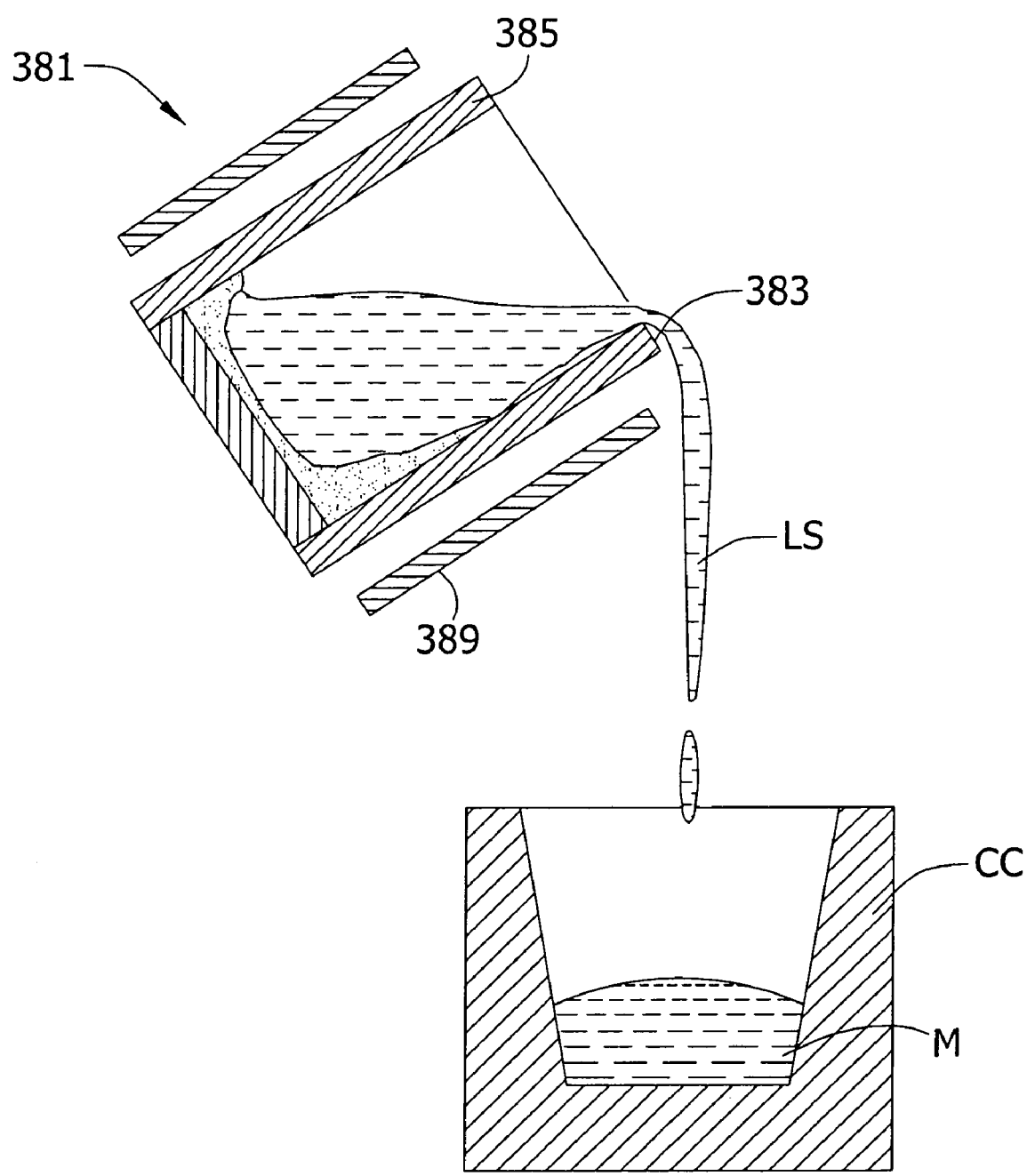
FIG. 23 is a schematic section of another embodiment of a melter assembly showing liquid silicon being transferred between the melting crucible and a main crucible of a crystal forming apparatus.

FIG. 23 shows a melter assembly of another embodiment, generally indicated 381, that is similar to the previous embodiments except the melter assembly is designed to transfer liquid silicon LS into the crystal growing crucible CC by pouring liquid silicon over the top wall 383 of the melting crucible 385. The melter assembly 381 includes a heater 389 that heats the melting crucible 385 to melt solid polysilicon in a controlled environment separate from the crystal puller CP. The heater 389 may include induction coils as described above, resistance heaters, or any other suitable heater without departing from the scope of this invention. After the solid polysilicon has been melted, the melting crucible 385 is positioned above the crystal growth crucible CC and tilted so that liquid silicon LS is poured over the top wall of the crucible filling the crystal growth crucible. The crystal growth crucible CC may be filled continuously during the operation of the crystal puller or may be filled by a batch filling process at the end of a crystal pulling session.

Figure 24:
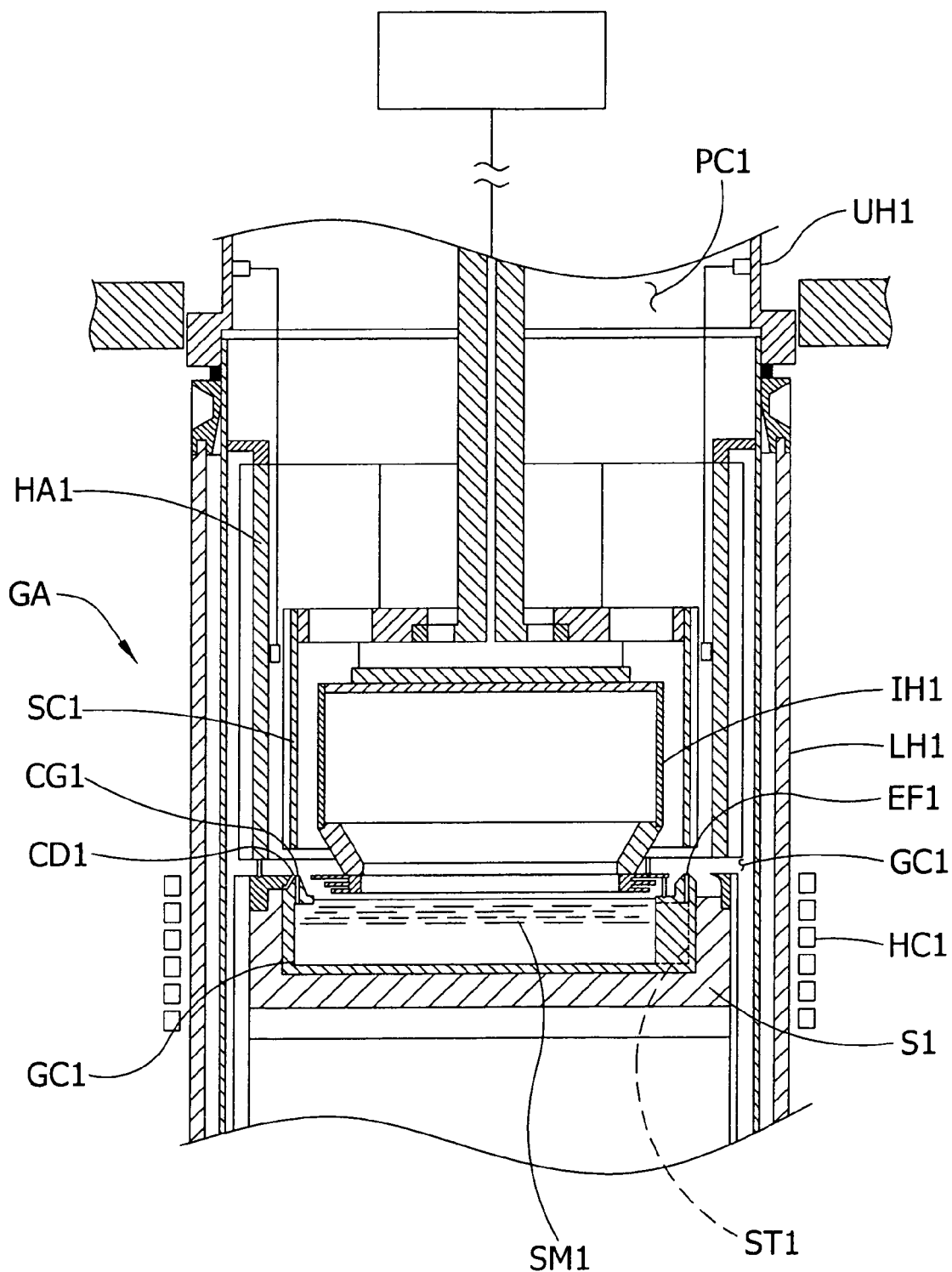
FIG. 24 is a schematic fragmentary section of a prior art crystal forming apparatus in the form of an EFG crystal puller.

FIG. 24 shows another prior art crystal forming apparatus in the form of an Edge-defined Film Growth (EFG) crystal growing apparatus, generally indicated GA. The particular apparatus GA illustrated is configured for growing hollow 8-sided polycrystalline silicon bodies (not shown) but it is understood that the apparatus may be configured for forming crystalline bodies having other shapes. The apparatus GA has a lower housing LH1 enclosing a crystal growth chamber GC1 and an upper housing UH1 enclosing a pull chamber PC1. The upper housing UH1 has been mostly broken away in FIG. 24. In the illustrated embodiment, the lower housing LH1 encloses a crucible/capillary die system including a growth crucible GC1, a capillary die CD1, a susceptor S1, an inner heater assembly IH1, and an outer heater assembly HA1.

The crucible GC1 contains a charge of molten source material SM1 (e.g., polycrystalline silicon) and is surrounded by a radio frequency heating coil HC1 for heating the source material in the crucible. The crucible GC1 has an end face, generally indicated EF1, having a capillary gap CG1 formed therein located generally near the peripheral edge of the crucible. The capillary gap cG1 and the crucible GC1 have a shape corresponding to the cross-sectional shape of the crystalline body formed by the apparatus GA. The crucible GC1 has slots ST1 formed on an inside wall of the crucible so that molten silicon SM1 may flow into the capillary gap CG1 and rise by capillary action. In the illustrated embodiment, the apparatus GA has a seed SC1 that is octagonally shaped to correspond with the shape of the capillary gap CG1. The seed SC1 is lowered into contact with the molten silicon SM1 in the capillary gap CG1 to initiate the growth sequence. As the seed SC1 rises from the capillary die CD1, the molten silicon SM1 in the gap CG1 is drawn out of the die and molten silicon from the crucible GC1 rises by capillary action in the capillary gap to replenish the material removed from the crucible. Reference may be made to U.S. Pat. Nos. 5,156,978, 4,647, 437, 4,440,728, 4,230,674 and 4,036,666, the disclosures of which are incorporated herein by reference, for additional information regarding conventional EFG crystal forming apparatus.

Figure 25:
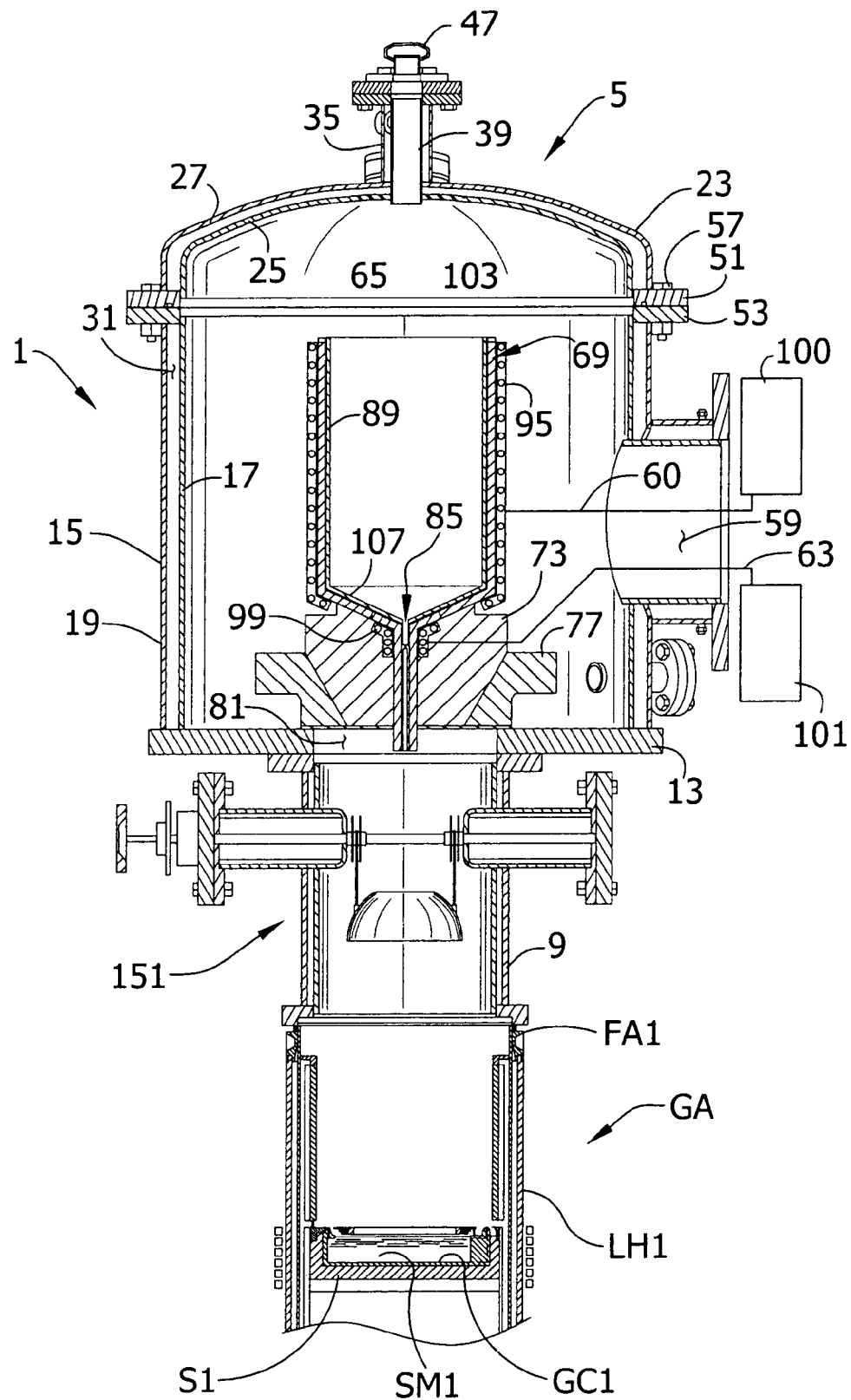
FIG. 25 is a schematic fragmentary section of the melter assembly installed on a lower housing of the crystal forming apparatus of FIG. 24.

FIG. 25 shows the melter assembly of the present invention installed on the EFG crystal forming apparatus GA1 of FIG. 24. It is understood that the melter assembly 1 connects to the apparatus GA1 by removing the upper housing UH1 enclosing the pull chamber PC1 and connecting the docking collar 9 of the melter assembly to a flange FA1 on the lower housing of the crystal forming apparatus. The melter assembly 1 is then operated in a similar fashion as discussed above to fill the crucible GC1 of the EFG crystal forming apparatus GA1 with molten silicon SM1. When the crucible GC1 of the crystal forming apparatus GA1 is filled with molten silicon SM1, the melter assembly 1 is removed and replaced with the upper housing UH1 for operation of the crystal forming apparatus.

Figure 26:
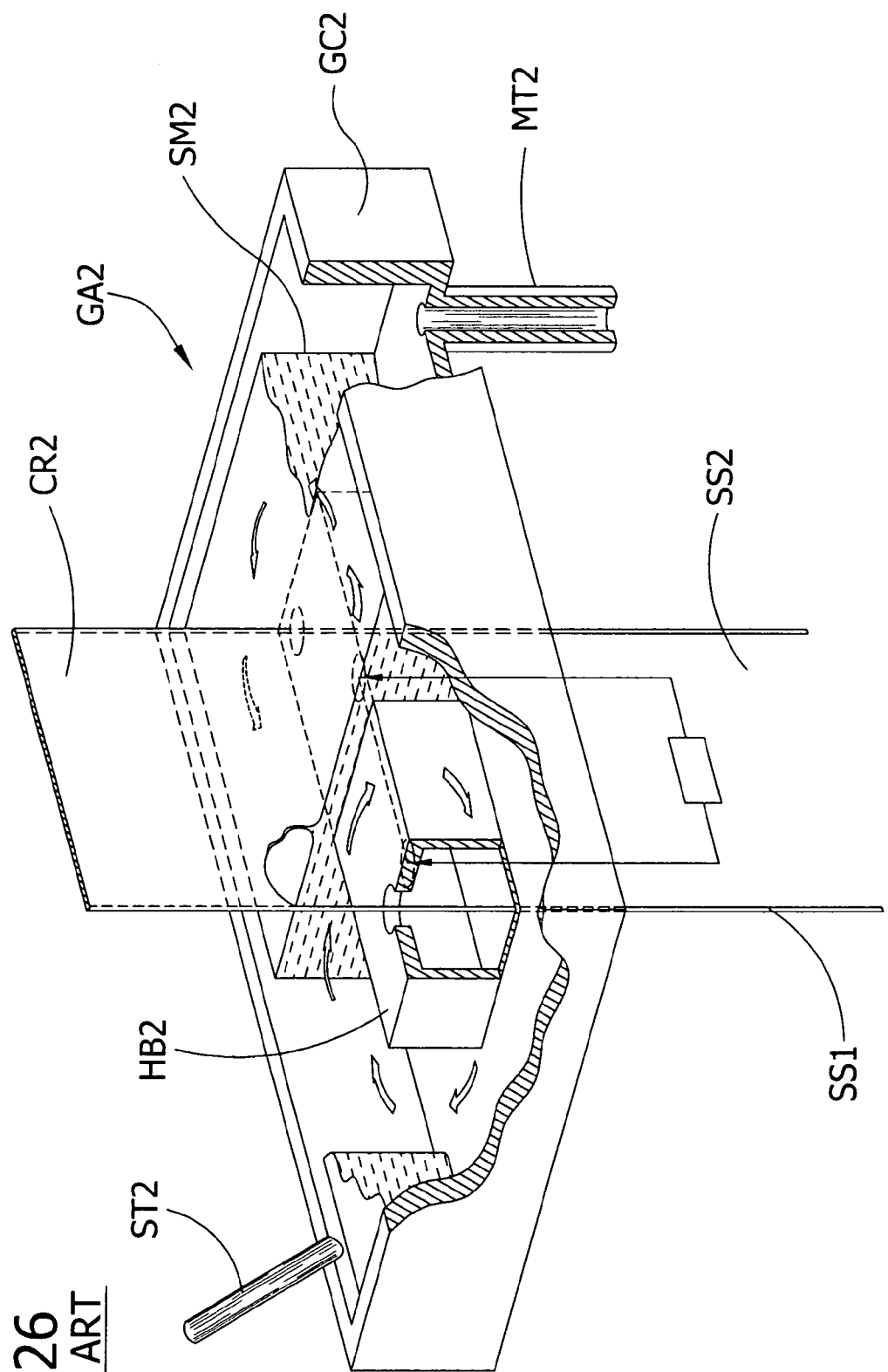
FIG. 26 is a partial perspective of a prior art ribbon growth crystal forming apparatus.

FIG. 26 shows another prior art crystal forming apparatus, generally indicated GA2, for which the melter assembly 1 of the present invention may be used to supply molten source material SM2. The crystal forming apparatus GA2 of FIG. 26 is a crystal pulling apparatus that uses the String Stabilized Growth (SSG) method to produce a solid crystalline ribbon CR2 which is grown from the melt SM2 contained in a crucible GC2. This crystal forming apparatus GA2 produces a thin, wide sheet of large grain polycrystalline silicon or monocrystalline silicon that is suitable for use in the production of solar cells or other semiconductor devices.

As shown in FIG. 26, the apparatus, GA2 includes two spaced apart strings SS1, SS2 that pass through the crucible GC2 and melt SM2 contained therein. Current is induced in the melt SM2 by a DC source (not shown) electrically connected to the crucible GC2 which causes flow circulation of the melt. A hollow barrier HB2 in the crucible GC2 reduces the melt depth from which the crystal CR2 is grown and increases the quality of the crystal. It is understood that solid polycrystalline silicon (not shown) may be added to the crucible GC2 via a supply tube ST2 and melted therein to form the melt SM2. A heating coil HC2 (FIG. 27) surrounds the crucible GC2 for heating the solid source material and the melt SM2 in the crucible. The crucible GC2 has a melt tube MT2 for emptying the crucible after the melt SM2 has become impure so that the melt may be replaced with fresh source material. As the strings SS1, SS2 are drawn upward from the crucible GC2, liquid silicon between the strings is removed from the crucible and solidifies as it cools to form a ribbon CR2 of solid polycrystalline silicon. It is understood that the apparatus of FIG. 26 would include a lower housing LH2 (see, FIG. 27) enclosing the crucible GC2 and an upper housing (not shown) enclosing a pulling apparatus for pulling the strings and the ribbon CR2. Reference may be made to U.S. Pat. Nos. 4,689,109, 4,661,200, and 4,627,887, the disclosures of which are incorporated herein by reference, for additional information regarding the SSG crystal forming apparatus.

Figure 27:
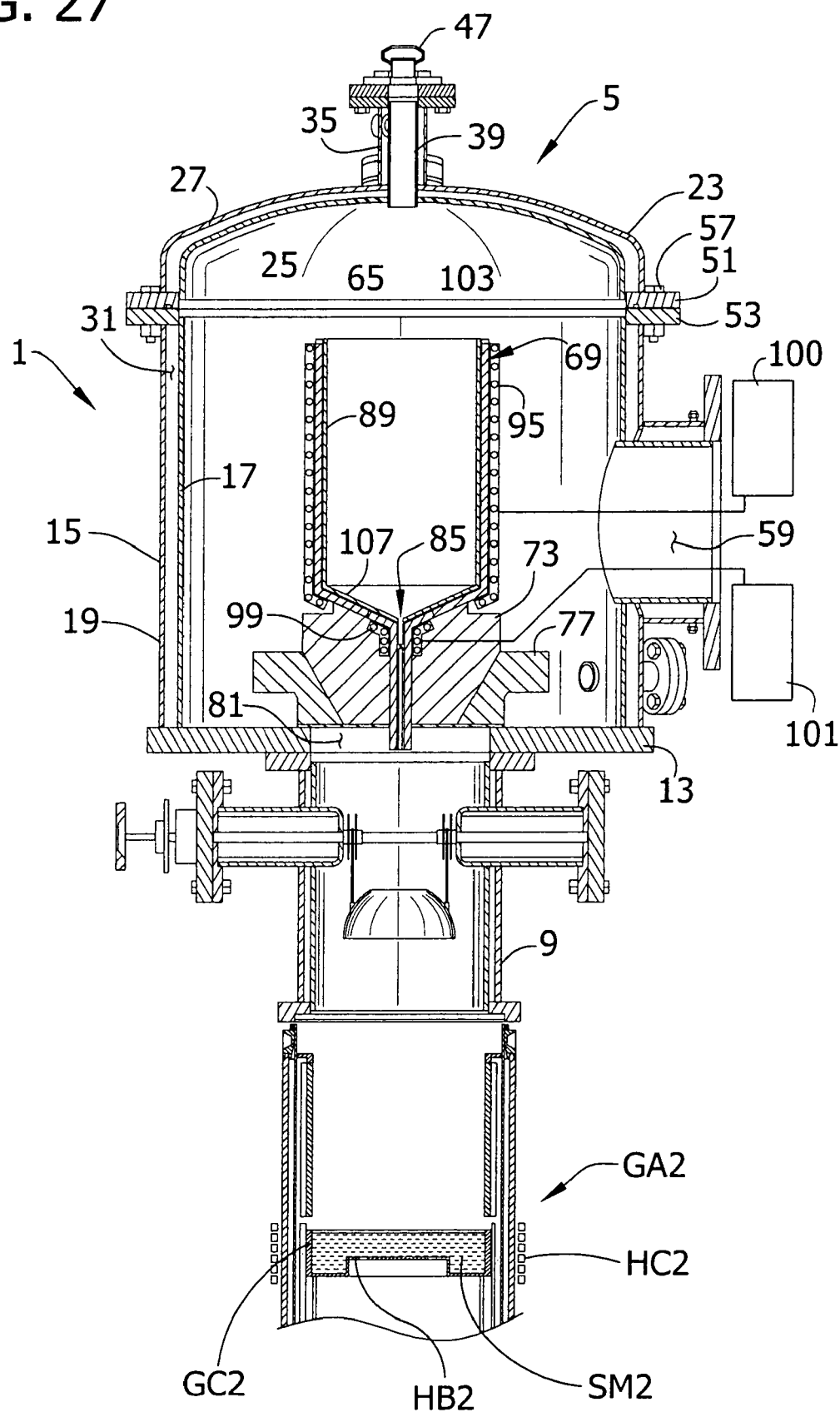
FIG. 27 is a schematic fragmentary section of the melter assembly installed on a lower housing of the crystal forming apparatus of FIG. 26.

As shown in FIG. 27, the melter assembly 1 of the present invention may be positioned in place of the upper housing above the crucible GC2 of the SSG crystal pulling apparatus GA2 to recharge the crucible with molten silicon SM2. The melter assembly 1 would be operated in a similar manner as discussed above for the previous embodiments to deliver the molten silicon SM2 to the SSG crystal forming apparatus GA2.

Figure 28:
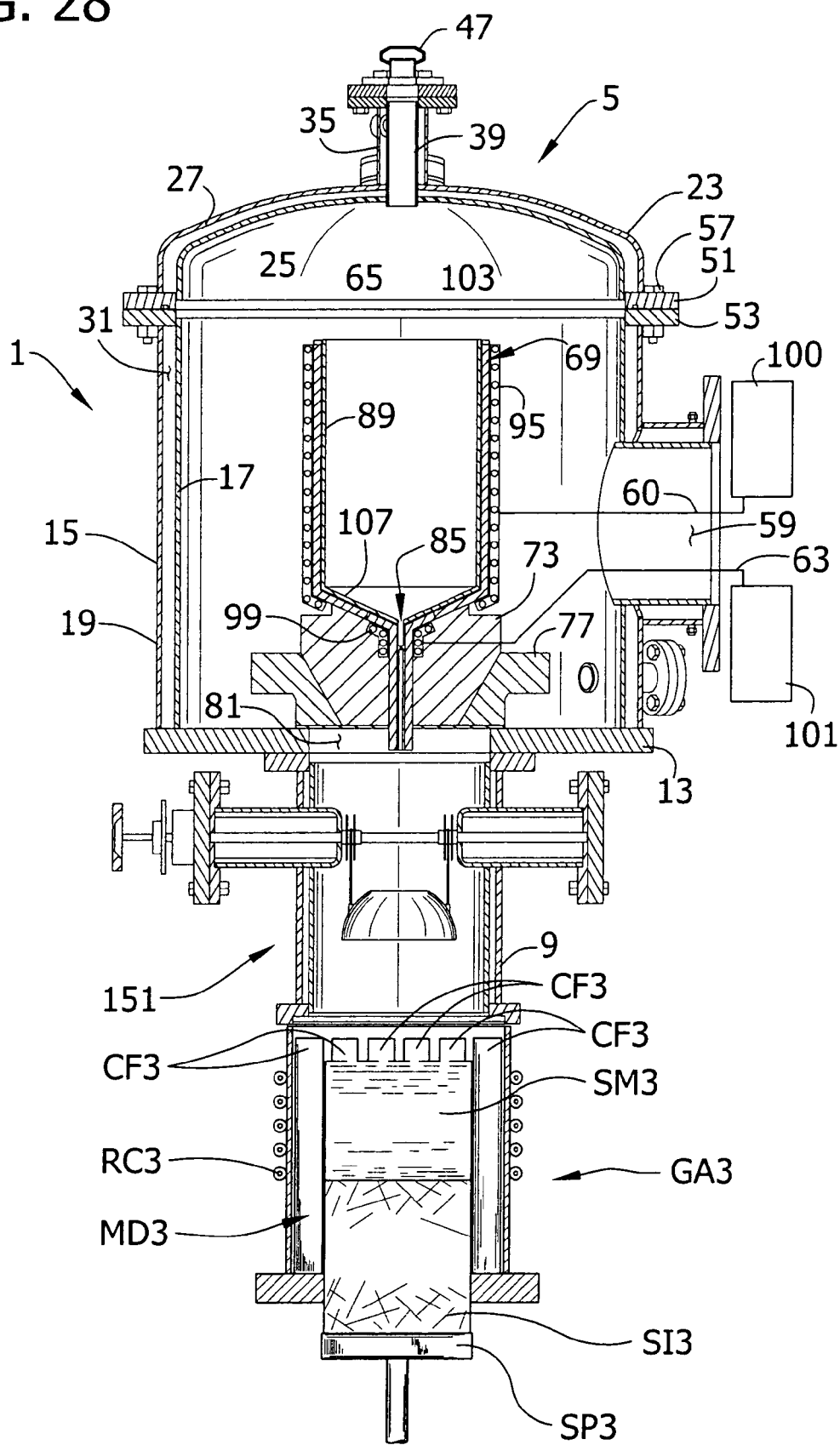
FIG. 28 is a schematic fragmentary section of the melter assembly installed above a prior art crystal forming apparatus in the form of a casting crucible.

As shown in FIG. 28, the melter assembly of the present invention may be used to supply molten source material SM3 to a casting apparatus, generally indicated GA3, for casting solid crystalline ingots SI3. In the embodiment of FIG. 28, the casting apparatus GA3 is a continuous casting apparatus having a retractable support member SP3 below a mold, generally indicated MD3. In the illustrated embodiment, the mold MD3 includes a series of spaced apart crucible fingers CF3 that are surrounded by an RF coil RC3. The RF coil RC3 induces a current in the crucible fingers CF3 and an oppositely charged current in the molten source material SM3 so that the molten material is repelled from the crucible fingers and contained in the casting apparatus GA3. Cooling liquid (not shown) is circulated through the crucible fingers CF3 to help cool the molten source material SM3.

Solid silicon ingots SI3 are formed in the casting apparatus GA3 by lowering the support member SP3 away from the crucible fingers CF3. As the retractable support member SP3 is slowly lowered away from the bottom of the crucible fingers CF3, the induced current in the bottom portion of the molten material SM3 gradually decreases allowing the molten material to cool as it moves away from the crucible fingers. The ingot SI3 is cast as the support member SP3 is lowered, allowing the molten source material SM3 that is removed from the crucible fingers CF3 to cool and solidify. Typically, solid source material (not shown) that is added from the top of the apparatus GA3 is melted in the apparatus to replenish the molten material SM3 that is removed when the retractable support member SP3 is lowered. As shown in FIG. 28, the melter assembly 1 of the present invention can be installed above the crucible fingers CF3 to replenish the quantity of molten source material SM3 that is used to cast the solid ingot SI3.

The melter assembly 1 may be operated in a similar manner as discussed above to provide a directed flow of molten source material SM3 to the casting apparatus GA3. In the illustrated embodiment, the melter assembly 1 is first positioned above the casting apparatus such that molten source material SM3 may be delivered to the mold MD3 formed by the crucible fingers CF3. After granular polysilicon GP (FIG. 10) is added to the melter assembly 1, the upper heating coil 95 in the melter assembly is operated to melt the source material in the melting crucible 65. The lower heating coil 99 is operated to melt the solid plug OP above the crucible nozzle 85 to allow molten source material LS to flow through the orifice 111 of the melter assembly 1 to deliver a directed stream of molten source material to the crucible GC3 of the crystal forming apparatus GA3. After the crucible GC3 of the crystal forming apparatus has been filled, the operation of the lower heating coil 99 is discontinued to allow the solid plug OP of solidified source material in the melter assembly to form. The solid plug OP prevents the flow of molten source material LS from the melter assembly 1 while the cast ingot SI3 is removed from the casting apparatus GA3 or a fresh casting apparatus is positioned below the melter assembly for the production of the next cast polycrystalline body.

It is understood that the casting apparatus GA3 shown in FIG. 29 may be replaced with a conventional cold crucible mold having a solid wall for batch casting solid ingots without departing from the scope of this invention. Reference is made to U.S. Pat. Nos. 4,769,107, 4,572,812, and 4,175,610 which is incorporated by reference herein, for additional information regarding casting processes capable of utilizing the melter assembly 1 of the present invention.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A method of servicing multiple crystal forming apparatus with a single melter assembly, the method comprising the steps of:
    positioning the melter assembly above a first crystal forming apparatus for delivering molten silicon to a crucible of the first apparatus;
    operating a heater in the melter assembly to melt source material in a melting crucible of the melter assembly;
    delivering a stream of molten source material from the melter assembly to the first crystal forming apparatus;
    moving the melter assembly to a position above a second crystal forming apparatus for delivering molten silicon to a crucible of the second apparatus;
    delivering a stream of molten source material from the melter assembly to the second crystal forming apparatus.

2. A method as set forth in claim 1 wherein operating a heater in the melter assembly to melt source material comprises providing electrical power to an upper induction coil of the heater.

3. A method as set forth in claim 1 wherein delivering a stream of molten source material comprises providing electrical power to a lower induction coil of the heater to initiate flow through an orifice of the melter assembly.

4. A method as set forth in claim 1 further comprising discontinuing the flow of molten source material from the melting crucible by discontinuing the operation of the heater.

5. A method as set forth in claim 4 wherein the step of discontinuing the flow of molten source material comprises forming a solid plug of source material preventing flow from the melting crucible.

6. A method as set forth in claim 1 further comprising growing a monocrystalline ingot from the source material delivered to at least one of said first crystal forming apparatus and said second crystal forming apparatus.

7. A method as set forth in claim 1 further comprising forming a polycrystalline body from the source material delivered to at least one of said first crystal forming apparatus and said second crystal forming apparatus.

8. A method as set forth in claim 7 wherein said polycrystalline body comprises a hollow polygonal silicon body formed by an Edge-defined Film Growth method.

9. A method as set forth in claim 7 wherein said polycrystalline body comprises a ribbon of polycrystalline silicon.

10. A method as set forth in claim 7 wherein said polycrystalline body comprises a cast silicon body.

11. A method as set forth in claim 1 wherein said moving the melter assembly to a position above the second crystal forming apparatus comprises lifting the melter assembly.

12. A method as set forth in claim 1 further comprising connecting the melter assembly to a lower housing of the second crystal forming apparatus prior to delivering a stream of molten source material to the second crystal forming apparatus.

13. A method as set forth in claim 1 wherein operation of an upper induction coil to melt source material in the melting crucible further comprises forming an unmelted plug of solid source material in the nozzle at the bottom of the melting crucible.

14. A method as set forth in claim 1 wherein delivering the stream of molten source material to the first crystal forming apparatus comprises delivering the stream of molten source material to the first crystal forming apparatus at a flow rate of between about 50 kg/hr and about 140 kg/hr.

15. A method as set forth in claim 1 wherein delivering the stream of molten source material to the second crystal forming apparatus comprises delivering the stream of molten source material to the second crystal forming apparatus at a flow rate of between about 50 kg/hr and about 140 kg/hr.

* * * * *